(12) United States Patent
Mukundan et al.

(10) Patent No.: US 12,061,847 B2
(45) Date of Patent: Aug. 13, 2024

(54) AGENT CONVERSIONS IN DRIVING SIMULATIONS

(71) Applicant: Zoox, Inc., Foster City, CA (US)

(72) Inventors: Priam Mukundan, Foster City, CA (US); Chonhyon Park, Foster City, CA (US); Maxwell Chandler Robinson, Foster City, CA (US); Tod Cameron Semple, Woodside, CA (US)

(73) Assignee: Zoox, Inc., Foster City, CA (US)

( * ) Notice: Subject to any disclaimer, the term of this patent is extended or adjusted under 35 U.S.C. 154(b) by 725 days.

(21) Appl. No.: 17/184,128

(22) Filed: Feb. 24, 2021

(65) Prior Publication Data

US 2022/0269836 A1 Aug. 25, 2022

(51) Int. Cl.
*G06F 30/20* (2020.01)
*B60W 60/00* (2020.01)
*G07C 5/08* (2006.01)

(52) U.S. Cl.
CPC ....... *G06F 30/20* (2020.01); *B60W 60/00276* (2020.02); *G07C 5/085* (2013.01)

(58) Field of Classification Search
CPC .......... G06F 30/25; G06F 30/27; G06F 30/28; G06F 2111/00; G06F 2119/22; G06F 30/20; B60W 60/00276; G07C 5/085
See application file for complete search history.

(56) References Cited

U.S. PATENT DOCUMENTS

| | | |
|---|---|---|
| 9,836,895 B1 | 12/2017 | Nygaard et al. |
| 10,795,804 B1 | 10/2020 | Nygaard |
| 10,831,202 B1 | 11/2020 | Askeland et al. |
| 11,565,709 B1 * | 1/2023 | Caldwell ................. G06N 3/088 |
| 2018/0157770 A1 * | 6/2018 | Kim ........................ G06F 30/20 |
| 2018/0267538 A1 * | 9/2018 | Shum ...................... B60W 30/09 |
| 2019/0354643 A1 * | 11/2019 | Shum ...................... G06F 30/20 |
| 2020/0050536 A1 * | 2/2020 | Nygaard ............. G06F 11/3684 |

(Continued)

FOREIGN PATENT DOCUMENTS

RU    2377658 C1    12/2009

OTHER PUBLICATIONS

PCT IPRP for corresponding PCT Application No. PCT/US2022/016746 dated Sep. 7, 2023, 7 pages.

(Continued)

*Primary Examiner* — Kibrom K Gebresilassie
(74) *Attorney, Agent, or Firm* — Lee & Hayes, P.C.

(57) ABSTRACT

Techniques are discussed herein for executing log-based driving simulations to evaluate the performance and functionalities of vehicle control systems. A simulation system may execute a log-based driving simulation including playback agents whose behavior is based on the log data captured by a vehicle operating in an environment. The simulation system may determine interactions associated with the playback agents, and may convert the playback agents to smart agents during the driving simulation. During a driving simulation, playback agents that have been converted to smart agents may interact with additional playback agents, causing a cascading effect of additional conversions. Converting playback agents to smart agents may include initiating a planning component to control the smart agent, which may be based on determinations of a destination and/or driving attributes based on the playback agent.

20 Claims, 11 Drawing Sheets

(56) References Cited

U.S. PATENT DOCUMENTS

| | | |
|---|---|---|
| 2020/0130709 A1 | 4/2020 | Rodionova |
| 2020/0247412 A1* | 8/2020 | Wang .................... B60W 50/14 |
| 2020/0249674 A1 | 8/2020 | Dally |
| 2022/0204009 A1* | 6/2022 | Choi ................... G06F 11/3696 |

OTHER PUBLICATIONS

Office Action for U.S. Appl. No. 17/184,169, dated Dec. 14, 2023, Tod Cameron Semple, "Simulated Agents Based on Driving Log Data", 30 pages.

The Search Report and Written Opinion for PCT Application No. PCT/US22/16746, dated Jun. 2, 2022, 9 pages.

Arbabzadeh N, et al.. A hybrid approach for identifying factors affecting driver reaction time using naturalistic driving data. Transportation research part C: emerging technologies. Mar. 1, 2019; 100: 107-24 .. (Year: 2019).

Fan X, et al. A personalized traffic simulation integrating emotion using a driving simulator. The Visual Computer. Jun. 2020;36:1203-18 (Year: 2020).

Office Action for U.S. Appl. 17/184,169, Dated Jun. 12, 2024, 29 pages.

* cited by examiner

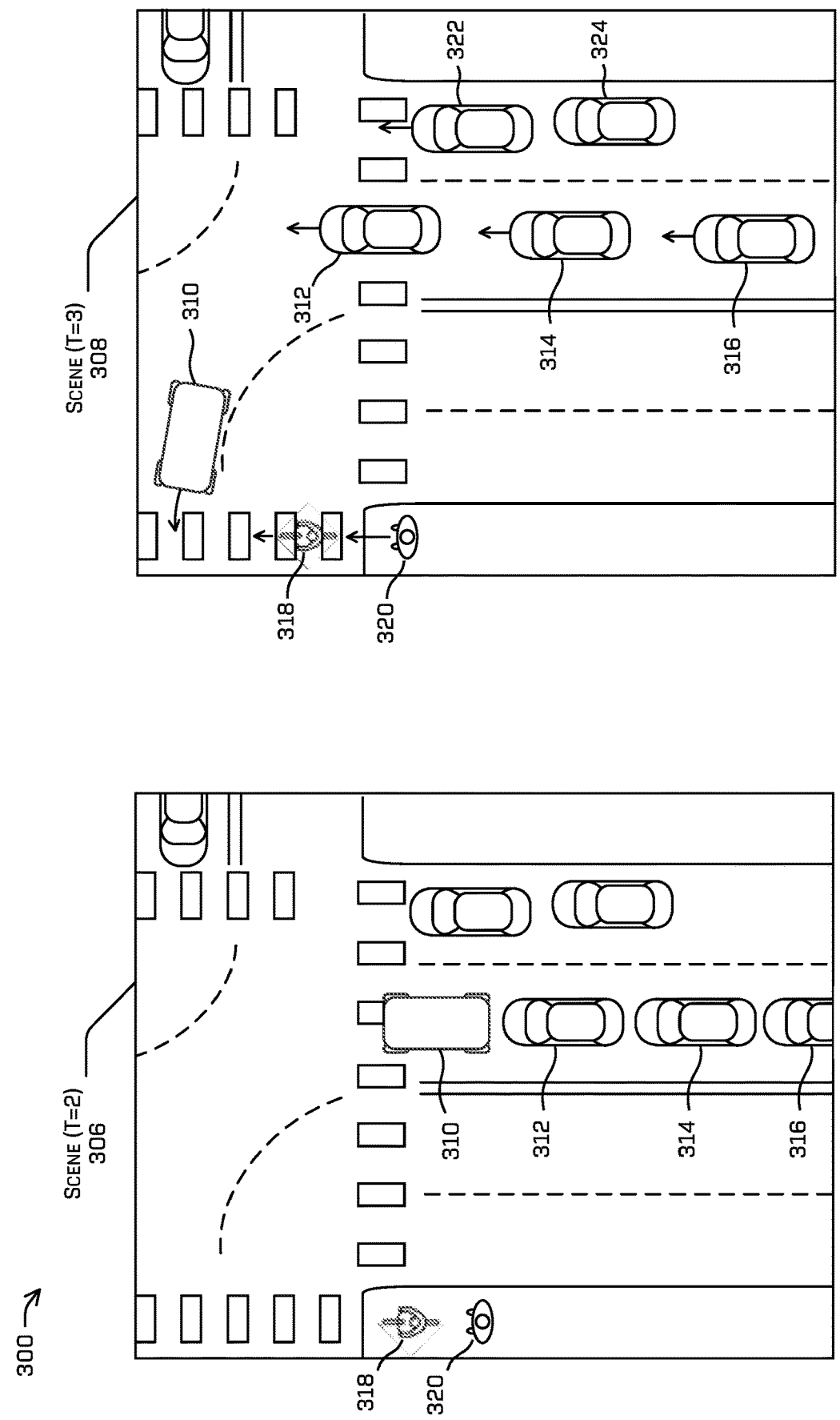

AGENT CONVERSIONS IN DRIVING SIMULATIONS

BACKGROUND

Simulations can be used to test and validate the features and functionalities of systems, including those that may be otherwise prohibitive to test in real world environments for example, due to safety concerns, limitations on time, repeatability, etc. For example, autonomous vehicles may use driving simulations to test and improve the performance of the vehicle control systems with respect to passenger safety, vehicle decision-making, sensor data analysis, route optimization, and the like. However, driving simulations that accurately reflect real world scenarios may be difficult and expensive to create and execute, as the data used to create such simulations may be noisy, inconsistent, or incomplete. Additionally, execution of driving simulations may involve executing multiple different interacting systems and components, including the vehicle control systems being evaluated, as well as agents and other objects in the simulated environment, which may be resource and computationally expensive.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIGS. 3A-3D depict scenes at four different times during a log-based driving simulation, in accordance with one or more implementations of the disclosure.

DETAILED DESCRIPTION

Figure 1:
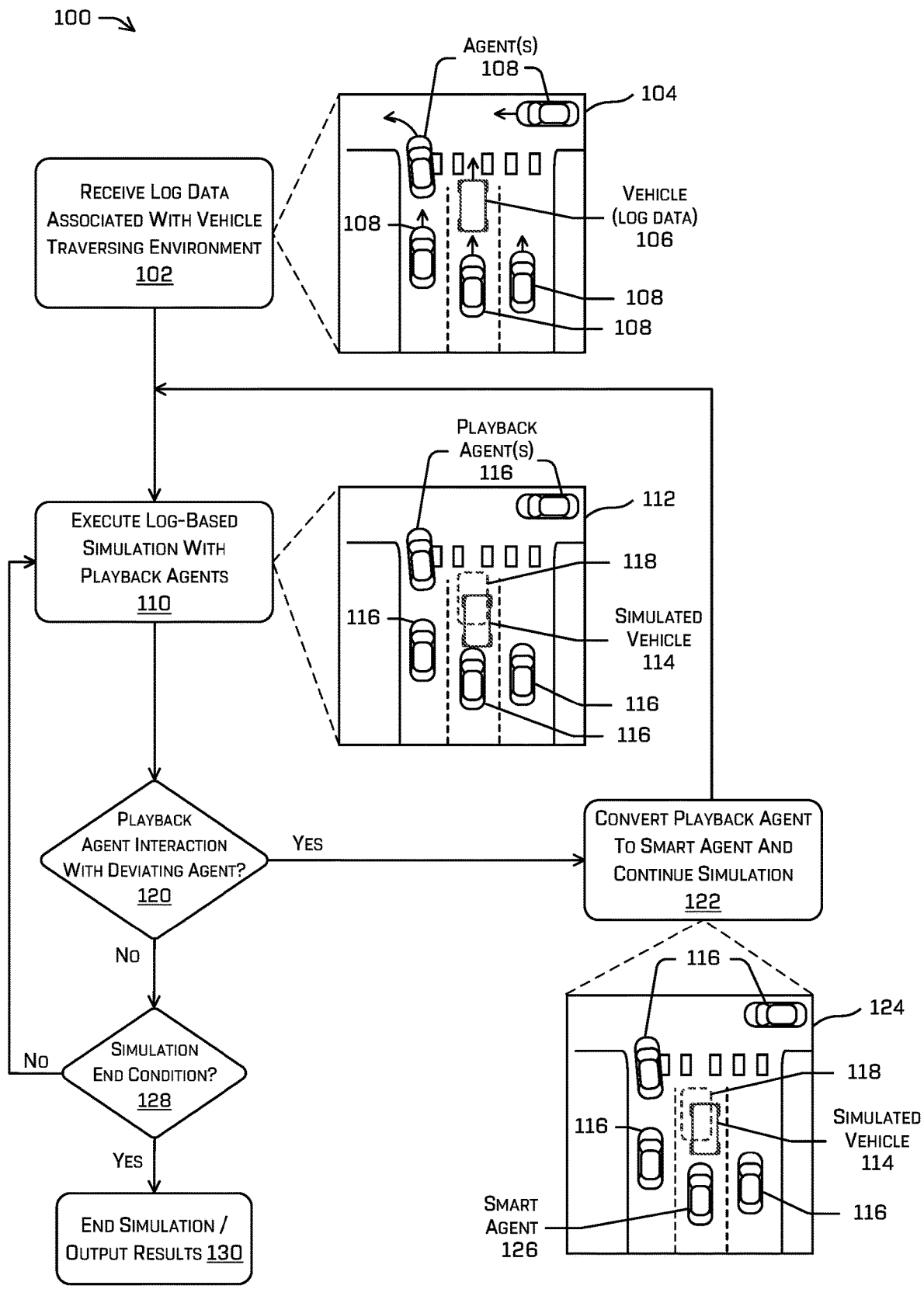
FIG. 1 illustrates an example process of executing a log-based driving simulations and converting playback agents to smart agents during the simulation, in accordance with one or more implementations of the disclosure

Techniques are discussed herein for executing log-based driving simulations to evaluate the functionalities and performance of vehicle control systems. Some techniques described herein include performing log-based driving simulations using a simulation system configured to execute vehicle control systems and evaluate the responses of the vehicle control systems to a dynamic simulation environment. Within log-based driving simulations, the simulated environment may include playback agents, which operate based on log data associated with corresponding agents observed in a real (e.g., non-simulated or physical) environment. For example, a real (e.g., non-simulated) vehicle traversing an environment may store log data collected by sensors and/or perception systems of the vehicle, including log data representing agents and other objects observed by the vehicle, such as other vehicles, bicycles, pedestrians, etc. The simulation system may generate and execute a log-based simulation based on the log data, in which playback agents are generated and provided in the simulation to correspond to the agents observed in the real environment. Each playback agent may be based on a corresponding agent represented in the log data, and may operate in the simulation in a similar or identical manner to the corresponding agent observed in the real environment.

During execution of log-based driving simulations, the simulation system may convert one or more of the playback agents to "smart agents" that may be controlled by a planning component, instead of or in addition to the log data. Unlike playback agents, a smart agent in a simulation may react to the simulated environment and make operating decisions or behaviors that deviate from the behaviors of a corresponding playback agent in the log data. For instance, a smart agent may detect a potential interaction (e.g., collision) with another agent in the simulation, and may change its speed or trajectory to avoid the interaction. A playback agent may be limited to actions of the agent recorded in a log with no independent decision-making capabilities.

In some examples, the simulation system may monitor the execution of a log-based simulation to determine interactions that have or will occur between playback agents and other agents during the simulation. In response to detecting an interaction involving a playback agent, the simulation system may convert the playback agent to a smart agent, allowing the smart agent to control its path as needed within the simulation to prevent the interaction. After a playback agent has been converted to a smart agent, it may deviate from the behavior of its corresponding playback agent in the log data. As the driving simulation continues, such deviations may result in the smart agent interacting with additional playback agents, thereby causing the simulation system to convert the additional playback agents into smart agents based on the interactions. The result may be a cascading effect of converting playback agents to smart agents during the execution of the driving simulation.

Additionally, in some implementations, the simulation system may analyze the log data to determine behaviors, attributes, and/or destinations associated with playback agents within the log data. When a playback agent is converted to a smart agent, the simulation system may execute a planning component to control the behavior and/or operation the smart agent. In some cases, the execution of the planning component for a smart agent may including initiating and/or controlling the planning component based on the determined destination and/or driving behaviors/attributes of the associated playback agent. For instance, the simulation system may analyze the route taken by a playback agent, and the driving behaviors and operations performed by a playback agent during the route, to determine one or more driving styles and/or driver personality types for the playback agent (e.g., an aggression metric, driving skill metric, reaction time metric, law abidance metric, etc.). The simulation system may configure the planning component to control the smart agent based on the destination of the playback agent, and/or based on parameters corresponding the driving style and/or driver personality exhibited by the playback agent.

The techniques described herein may be implemented in a number of ways. Example implementations are provided below with reference to the following figures. Although certain examples are discussed in the context of autonomous vehicles and log-based driving simulations, in other examples, the methods, devices, systems, computer-readable media, and/or other implementations described herein may be applied to a variety of other environments, such as utilization in semi-autonomous or non-autonomous vehicles, and/or within aviation or nautical contexts.

FIG. 1 depicts an example process 100 of executing a log-based driving simulations, including converting playback agents to smart agents at one or more times during the simulation. In various implementations, some or all of the operations in process 100 may performed by driving simulation systems, such as simulation system(s) described in more detail below.

At operation 102, a simulation system may receive log data associated with a vehicle traversing an environment. In various examples, the log data may include data stored by a real or simulated vehicle traversing a real or simulated environment. As shown in box 104, a vehicle 106 may traverse an environment including a number of agents 108 and/or other additional objects. The log data may include data observed and/or perceived by the vehicle 106, such as data identifying characteristics of the environment, agents 108 detected within the proximity of the vehicle 106, attributes or characteristics of the environment, the agents, and/or other objects (e.g., classifications, sizes, shapes, positions, yaws, velocities, trajectories, etc.). In some instances, the log data may include operations and/or behaviors of the agents 108 and other objects, as well as events observed by the vehicle 106, such as accidents or near accidents, traffic violations, crossing or jaywalking by pedestrians, cyclists, or animals, weather anomalies, construction zones, detours, school zones, etc. These particular events or behaviors may be designated from a list of events/behaviors that are desirable for use as driving simulations.

The log data received in operation 102 may include raw sensor data and/or data based on sensor data associated with the vehicle 106, such as bounding boxes, velocities, classifications, object dimensions, predictions, object track information, control signals, etc. Examples of data generated by a vehicle 106 that can be included in the log data can be found, for example, in U.S. patent application Ser. No. 15/644,267, titled "Interactions Between Vehicle and Teleoperations System," filed Jul. 7, 2017, U.S. patent application Ser. No. 15/693,700 titled "Occupant Protection System Including Expandable Curtain and/or Expandable Bladder" and filed Sep. 1, 2017, and U.S. patent application Ser. No. 16/198,653 titled "Executable Component Interface and Controller" filed Nov. 21, 2018, each of which is incorporated by reference herein in its entirety for all purposes.

In some implementations, the simulation system may generate one or more log-based driving simulations based on the log data received in operation 102. To generate a log-based driving simulation, a simulation generator may use the log data received in operation 102 to generate simulation instructions that, when executed by a simulator, generate the simulated environment. Additional log data that may be used to generate a log-based driving simulation can include perception data, prediction data, and/or status data indicating diagnostic information, trajectory information, and other information generated by the vehicle 106. In some cases, the simulation generator may generate simulation scenarios by identifying within the log data, the static and/or dynamic objects (e.g., agents 108) in the environment, and various attributes and behaviors of the objects. In some instances, when generating a log-based simulation, a simulation system can omit objects represented in the log that do not meet or exceed a threshold level of interaction with the vehicle 106. By excluding objects that do not meet or exceed the threshold level of interaction with the vehicle 106, the simulation system can reduce an amount of computational resources required to generate and execute the log-based driving simulations.

At operation 110, the simulation system executes a log-based driving simulation, including playback agents based on the agents 108 detected within the log data. In various examples, log-based driving simulations may be used to test and validate the responses of a simulated vehicle to various simulated scenarios similar or identical to those that may be encountered in real world. For example, log-based driving simulations may model normal or abnormal driving conditions and/or vehicle conditions, using a variety of simulated environments, objects, and/or agents. Log-based driving simulations may model different traffic conditions, environmental conditions, roadway obstructions, accidents, etc., to test and validate passenger safety, vehicle routing, decision-making, efficiency, etc. Certain driving simulations may test the responses of the simulated vehicle to defective and/or faulty sensors on the vehicle. Certain driving simulations may test individual components or systems of the simulated vehicle (e.g., a sensor data perception component, a decision-making or planning component, etc.), while other driving simulations may test the simulated vehicle as a whole, including interactions between the various components or systems of the vehicle.

During the execution of a log-based driving simulation, the simulation system may execute a set of simulation instructions to simulate an environment similar or identical to the environment represented by the log data. As shown in box 112, during a log-based simulation a simulated vehicle 114 may be controlled by one or more vehicle control systems (or vehicle controllers), which may control the behavior of the simulated vehicle 114 in response to the simulated environment, objects, and agents. In some cases, a simulator component of the simulation system may execute a simulation scenario which provides data representing the simulated environment and objects to the process (es) executing the vehicle controllers, which may respond by providing back to the process(es) executing the simulation scenario data representing the operations and behaviors of the simulated vehicle 114 during the simulation.

At the beginning of a log-based driving simulation, each of the simulated agents initially may be playback agents 116. As noted above, playback agents may be configured to operate based on the log data previously collected within the non-simulated environment, and thus the playback agents 116 in the simulation may behave in a manner similar or identical to the behavior of the corresponding agent within the log data. Because the previously collected log data is fixed and unchanging, neither the simulated environment nor the objects or agents within the simulation may be configured to react or respond to the behaviors of the simulated vehicle 114 or any other objects in the simulation. Accordingly, each agent depicted in box 112 may be a playback agent 116 at the start of the log-based simulation, which may operate in a fixed and predetermined manner.

In contrast, the simulated vehicle 114 in the log-based driving simulation may operate differently from the agent 108 that collected the log data associated with the non-simulated environment. In some examples, agent 108 and simulated vehicle 114 may be different vehicle types (and/or different agent types). Even when the agent 108 and simulated vehicle 114 are both implemented as autonomous vehicles, the simulated vehicle 114 may include different vehicle controllers from those of agent 108. For instance, the simulated vehicle 114 may include various different and/or updated software systems (e.g., a perception component, perception component, planning component, etc.) or may include different sets of vehicle capabilities, different planning/routing algorithm, or different sensor systems and/or sensor configurations, with respect to the software and/or hardware systems used by the agent 108. Accordingly, the simulated vehicle 114 may respond differently within the log-based simulation than would the agent 108 that captured the log data. Such differences between vehicle controllers and/or other vehicle software or hardware systems in the agent 108 and the simulated vehicle 114, may cause the behavior of the simulated vehicle 114 in the log-based simulation to deviate from the behavior the of the agent 108. In this example, the simulated vehicle 114 is depicted in the box 112 at one position in the simulation scene, and the vehicle outline 118 indicates a different position corresponding to the position of the agent 108 within the log data at the same relative time.

Simulated vehicle 114 can, for example, be an autonomous vehicle to be tested in simulation by determining simulated vehicle's 114 responses to simulated agents (such as agent 108). In simulation, various aspects of simulated vehicle 114 can be modified (e.g., relating to perception, prediction, and/or planner components) to test, for example, new versions of the components. Log data can be used for simulations in order to recreate real world driving conditions and agent interactions. However, if simulated vehicle 114 operates differently than what is recorded in log data, agents created from log data also may interact differently. Maintaining integrity of a simulation can include maintaining real world behaviors and interactions of agents (e.g., playback agents) while still accounting for differences in simulated vehicle 114 interactions with the environment (e.g., via smart agents).

At operation 120, the simulation system may determine whether any of the playback agents 116 in the driving simulation interact with any deviating non-playback agents. As used herein, a deviating agent may refer to an agent, such as the simulated vehicle 114 or a smart agent, whose state within the driving simulation is different from the state of the corresponding agent within the log data. For instance, the simulated vehicle 114 may be identified as deviating in this example, because the position of the simulated vehicle 114 is different from the corresponding position of the agent 108 within the log data (indicated by vehicle outline 118). Determining whether an agent is deviating may be based on a comparison of the positions, as in this example, and/or may be based on comparing other vehicle attributes or states, such as yaw, velocity, trajectory, etc., between the simulated agent and the corresponding agent within the log data. Additionally, as described below, the simulation system may use deviation distance thresholds, other types of threshold comparisons (e.g., yaw deviation thresholds), and/or combinations of multiple deviation criteria to determine whether an agent is to be classified as deviating.

The simulation system may perform the determination at operation 120 periodically and/or continuously during the execution of the log-based simulation, and an interaction between a playback agent 116 and a different deviating agent may be determined at any time during the simulation. To determine an interaction between agents, the simulation system may use bounding boxes and/or other techniques (e.g., path polygons, corridors, etc.) to represent the position of the agents at various times during the simulation. In some examples, a bounding box for an agent may be determined for any point in time during the simulation, based on the size, position, yaw, and/or velocity of the agent at the point in time. The simulation system may determine an interaction between two agents, based on an overlap between the bounding boxes of the two agents at a particular point in time during the simulation. Accordingly, the interaction may represent a collision between the two agents, or a potential collision or near miss, at the point in time when the bounding boxes of the agents overlap.

When the simulation system determines that a playback agent 116 has interacted with (or will interact with) a deviating agent during the simulation (120:Yes), that at operation 122 the simulation system may convert the playback agent 116 to a smart agent to avoid the interaction. For example, as shown in box 124, the simulation system has converted the playback agent directly behind the simulated vehicle 114, into a smart agent 126. This conversion may be performed based on the determination that the associated playback agent 116 would have interacted (e.g., collided) with the simulated vehicle 114 which has deviated from its expected position based on the log data (e.g., vehicle outline 118). When converting the interacting playback agent 116 to the smart agent 126, the simulation system may execute or initiate a planning component for the smart agent 126 may use a planning component to analyze the simulated environment and determine a path for the smart agent 126 through the simulated environment. In various examples, the planning component used by the smart agent 126 may be identical to the planning component used by the simulated vehicle 114, or may be a simplified version of the component configured to avoid interactions with minimal trajectory adjustments. For instance, if the smart agent 126 is moving faster than an agent directly ahead of the smart agent, then, at a predetermined distance threshold, the planning component may reduce the speed of the smart agent 126 to match the speed of the agent directly ahead. In other cases, the planning component may cause the smart agent 126 to brake, steer, pause, accelerate, or perform other navigational maneuvers in the simulation to avoid interacting with other agents.

As noted above, at the beginning of a log-based driving simulation, some or all of the agents in the simulation may be playback agents 116 that behave based on the log data and/or do not include a planning component. However, the simulated vehicle 114 may include different vehicle controllers and/or configurations that cause deviations from the behavior of the corresponding agent 108 in the log data. The deviation of the simulated vehicle 114 may cause the simulation system to convert one or more of the playback agents 116 to smart agents. After a playback agent 116 has been converted to a smart agent 126, it may begin to use a planning component rather than relying solely on the log data to navigate through the simulated environment. Accordingly, as the driving simulation continues, the smart agent 126 also may deviate from its corresponding agent 108 in the log data. During this time period in the driving simulation, both the simulated vehicle 114 and the smart agent 126 may be deviating agents, and both may interact with and cause conversions of additional playback agents 116 into smart agents. In some examples, the result may be a cascading effect of conversions of playback agents into smart agents, that may continue for a period of time until the cascading effect runs its course locally within the simulation, or may continue until the simulation ends.

When, at the current time during the simulation, there are no playback agents to be converted into smart agents (120: No), then at operation 128 the simulation system may determine whether or not an end condition has been met for the simulation. Simulation end conditions may include, for example, a successful completion of the simulation, a time-out of a component, a collision or error occurring within the simulation, or a manual termination of the simulation by a user. If a simulation end condition has not occurred (128: No), then process 100 returns to operation 110 to continue the simulation. However, if a simulation end condition has occurred (128:Yes), then at operation 130 the simulation system may terminate the simulation and output or store the simulation results. In some examples, the simulation results may identify the behaviors and/or performance of the simulated vehicle 114 during the simulation, which may correspond to the behaviors and/or performance of the vehicle controllers being evaluated. When the driving simulation is one of a batch or sequence of simulations, process 100 may return to operation 102 to execute the next simulation in the batch or sequence using the same log data and same vehicle controllers for the simulated vehicle 114.

As illustrated by these and other examples, the techniques described herein provide a number of improvements and technical advantages for generating and executing driving simulations. Such advantages may include providing log-based simulations that are more robust and more durable with respect to changes in the vehicle controllers being tested, as well as simulations that more accurately represent real world driving scenarios. For example, in some simulation systems, when a log-based simulation results in a collision between the simulated vehicle and a playback agent, the simulation may be invalidated and/or discarded from a simulation test battery. As a result, the log-based tests in such systems are often short-lived and may quickly become outdated, since any change to the vehicle controllers of the simulated vehicle may cause the simulation to be invalidated. In contrast, the techniques described herein include selectively converting playback agents to smart agents, thus providing more robust and enduring simulations that may operate over longer periods of time with less failures, and less need for intervention and manual analysis, thereby increasing the number of usable simulation test and improving the efficiency and quality of simulation systems.

Additionally, some conventional systems may execute simulations that include large numbers of (or exclusively) smart agents rather than playback agents. In such systems, although the smart agents may successfully avoid collisions during the simulation, they may provide less realistic and less valuable driving simulations in some cases. For instance, playback agents may provide advantages over smart agents within simulations, because playback agents are based on real world log data and thus may provide more authentic scenarios that simulate environments with actual drivers who may drive in unexpected and unpredictable ways. Additionally, when a playback agent is converted to a smart agent during a log-based simulation, the simulation system may have only limited sensor and perception data from which to control the smart agent. Further, both the conversions of playback agents into smart agents, and the planning component operations the smart agents during the simulation may require additional computing resources which reduces the speed and efficiency of the simulation system and limits the number of simulations that may be performed. Therefore, the techniques described herein, which convert playback agents to smart agents on a limited and selective basis, and only when necessary during the simulation, may preserve larger numbers of playback agents for longer amounts of time during the simulation.

Figure 2A:
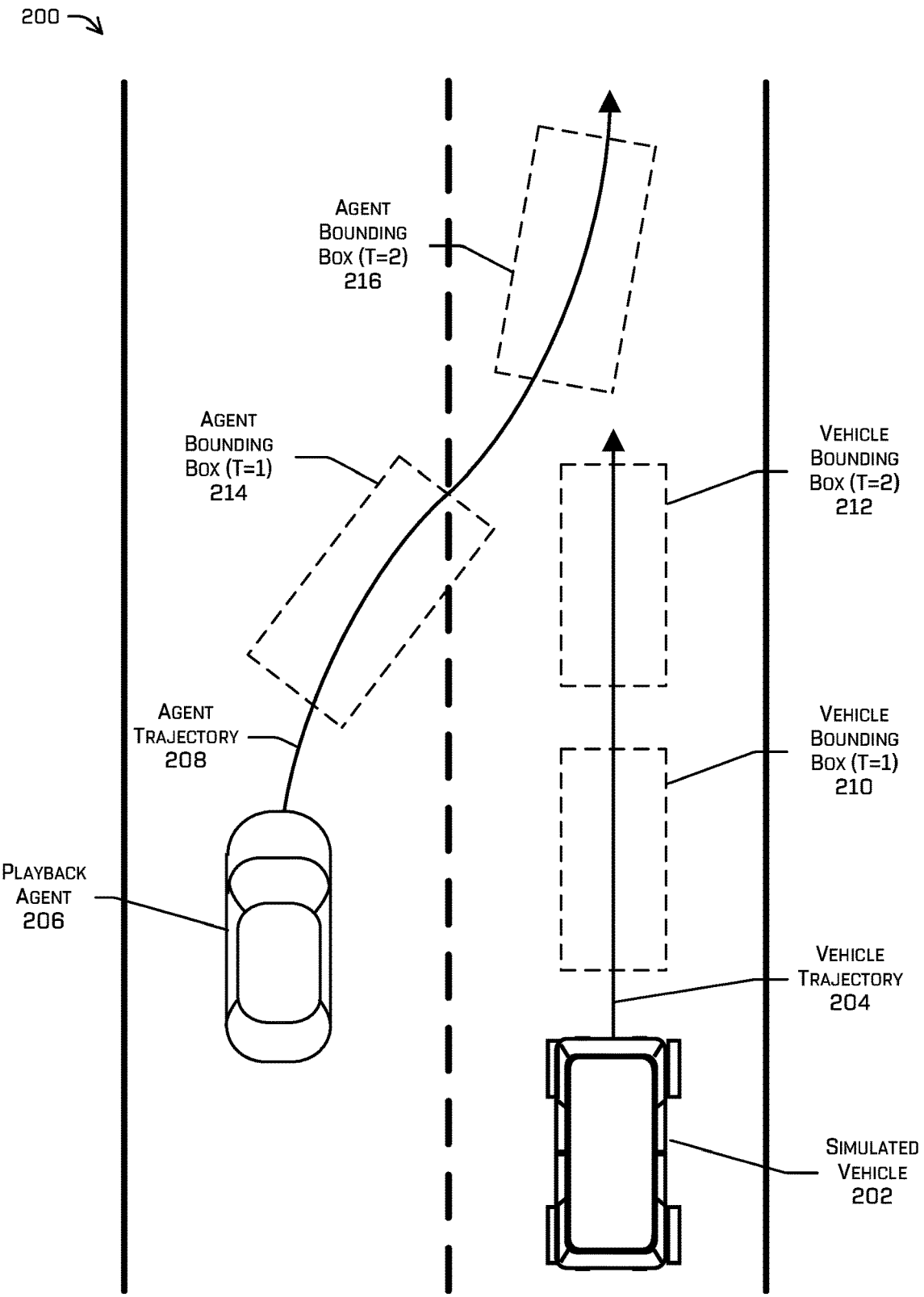
FIGS. 2A-2C illustrate example techniques for determining interactions between agents during log-based driving simulations, in accordance with one or more implementations of the disclosure.
Figure 2B:
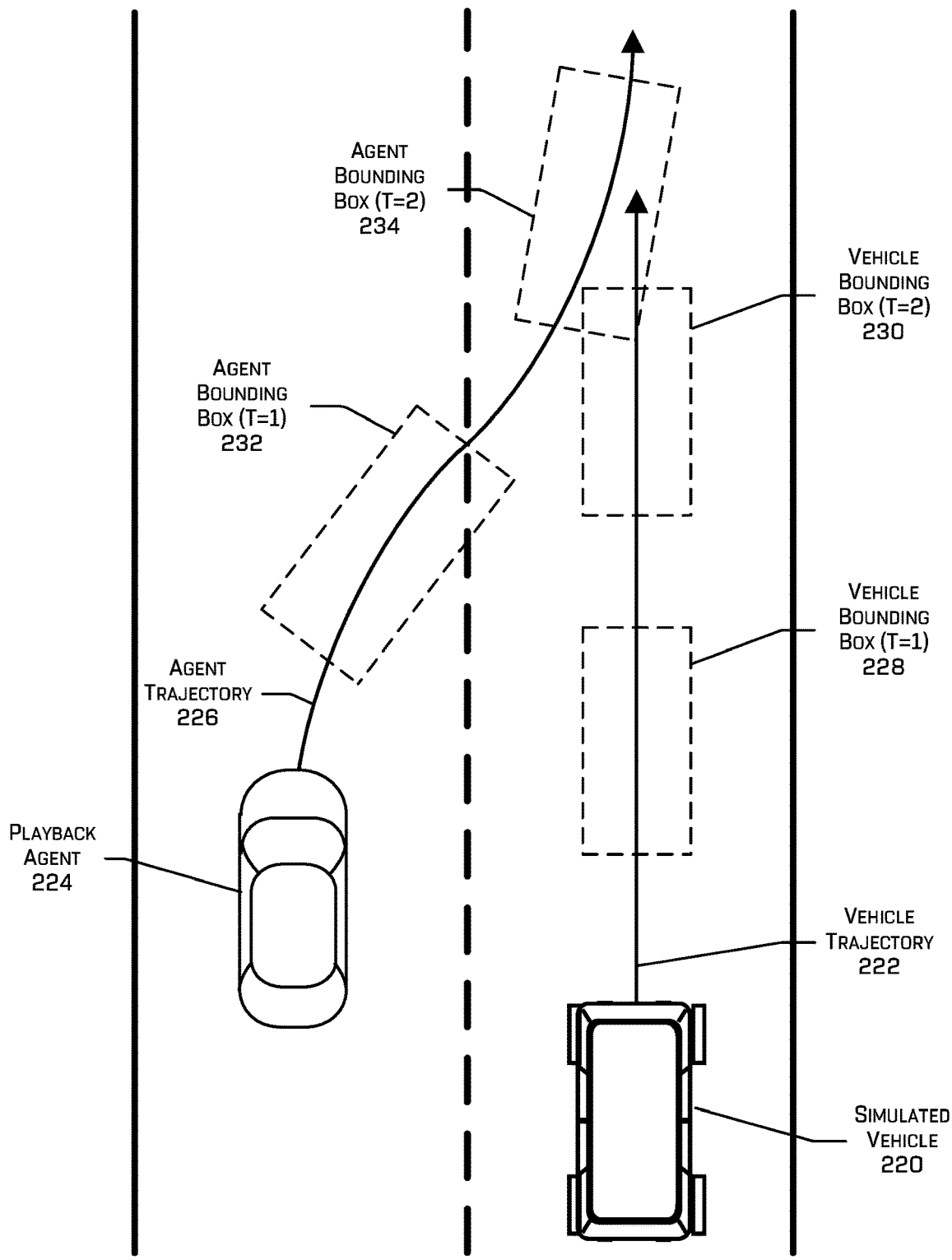
Figure 2C:
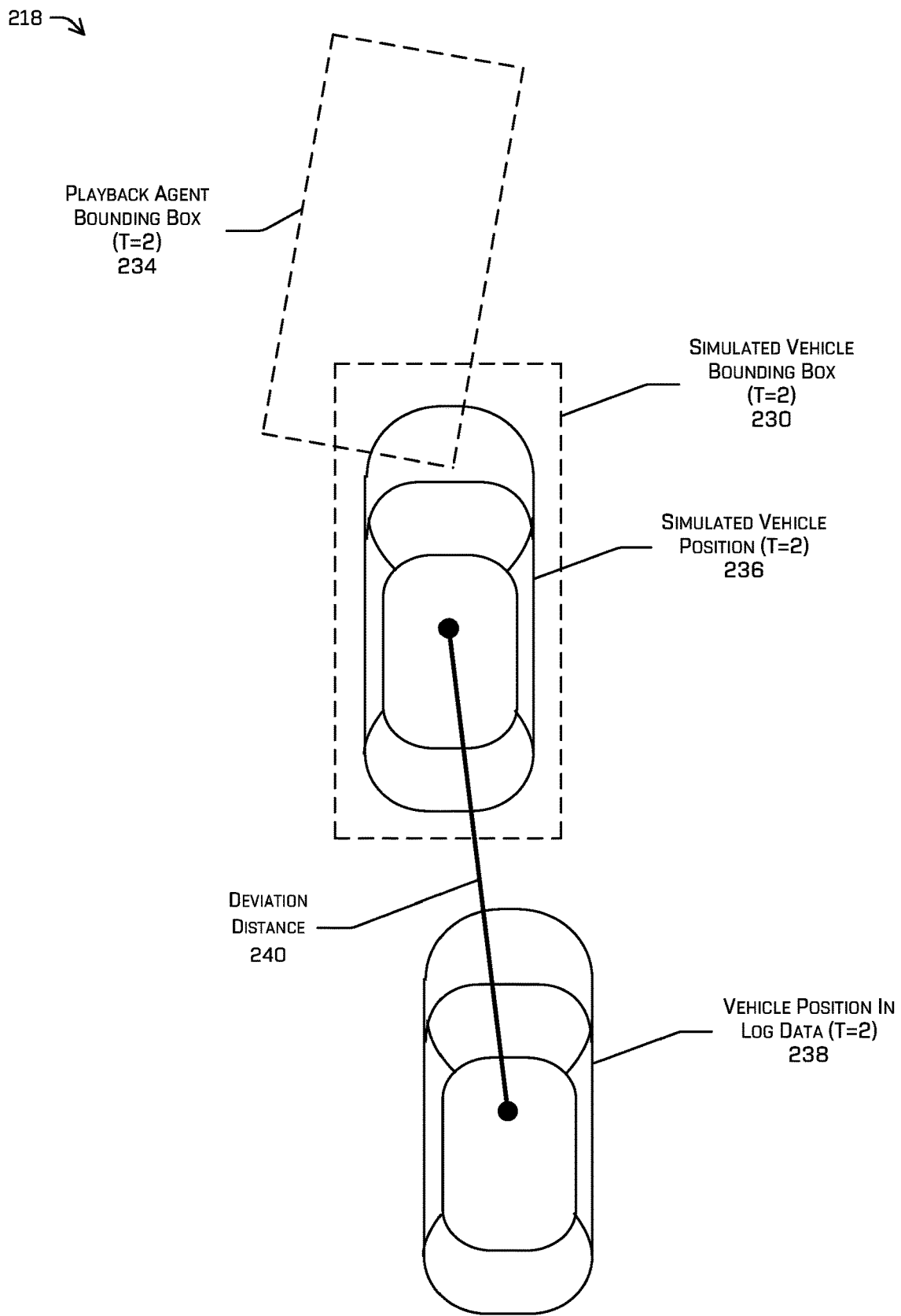
Figure 3B:
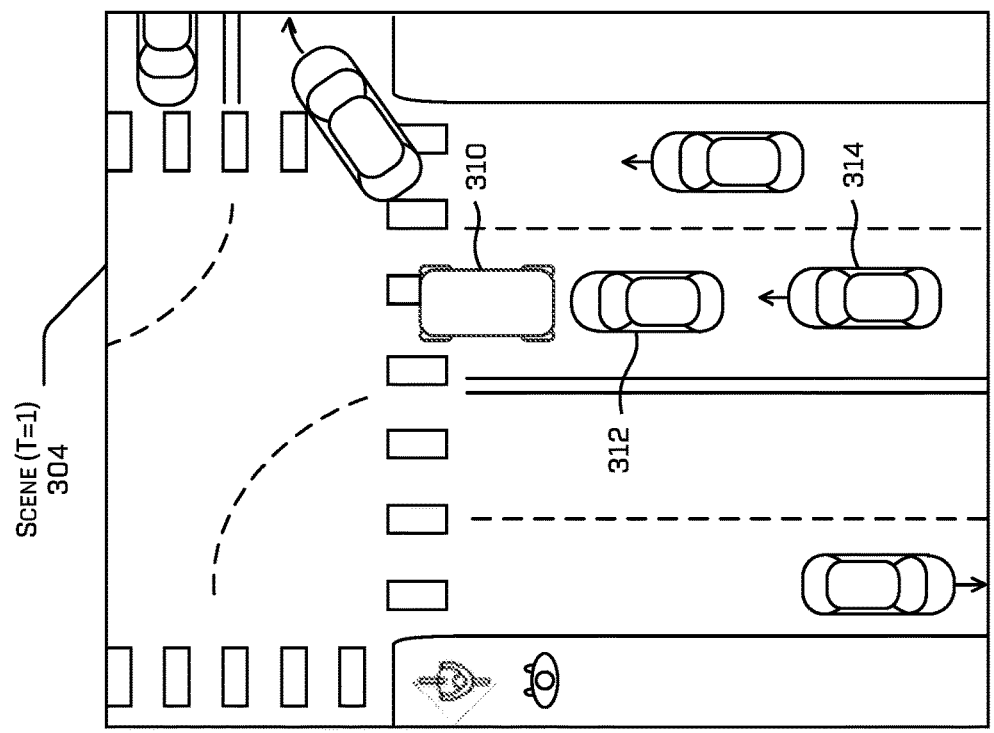
Figure 3A:
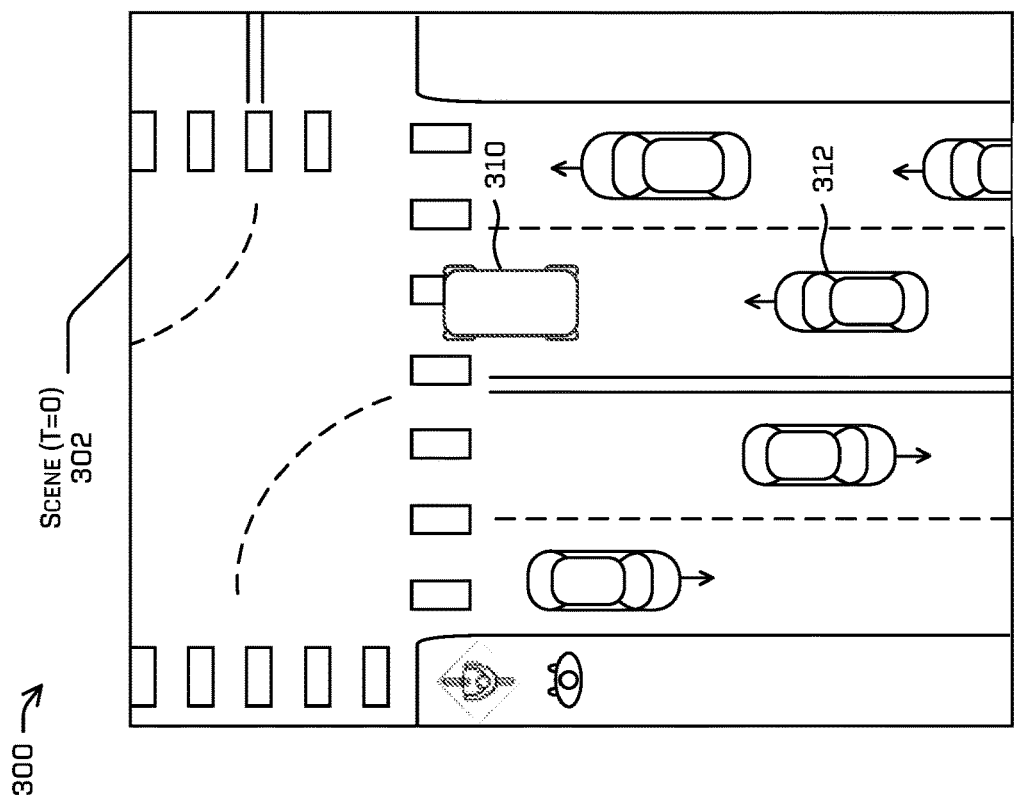
Figure 4B:
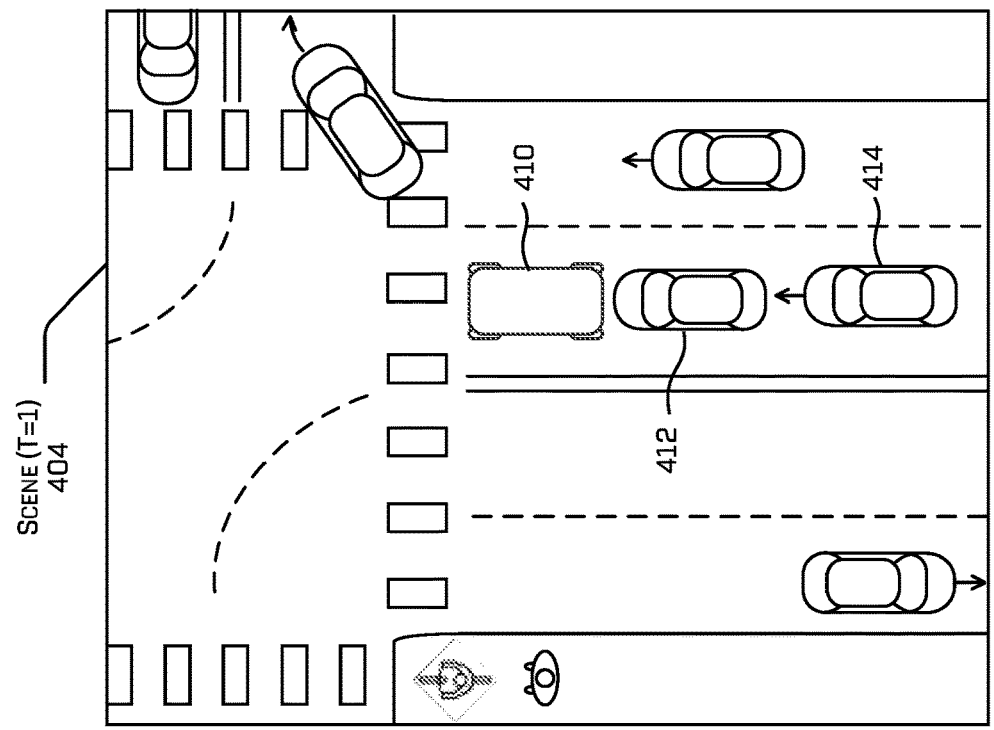
FIGS. 4A-4D depict scenes at four different times during another log-based driving simulation, in accordance with one or more implementations of the disclosure.
Figure 4A:
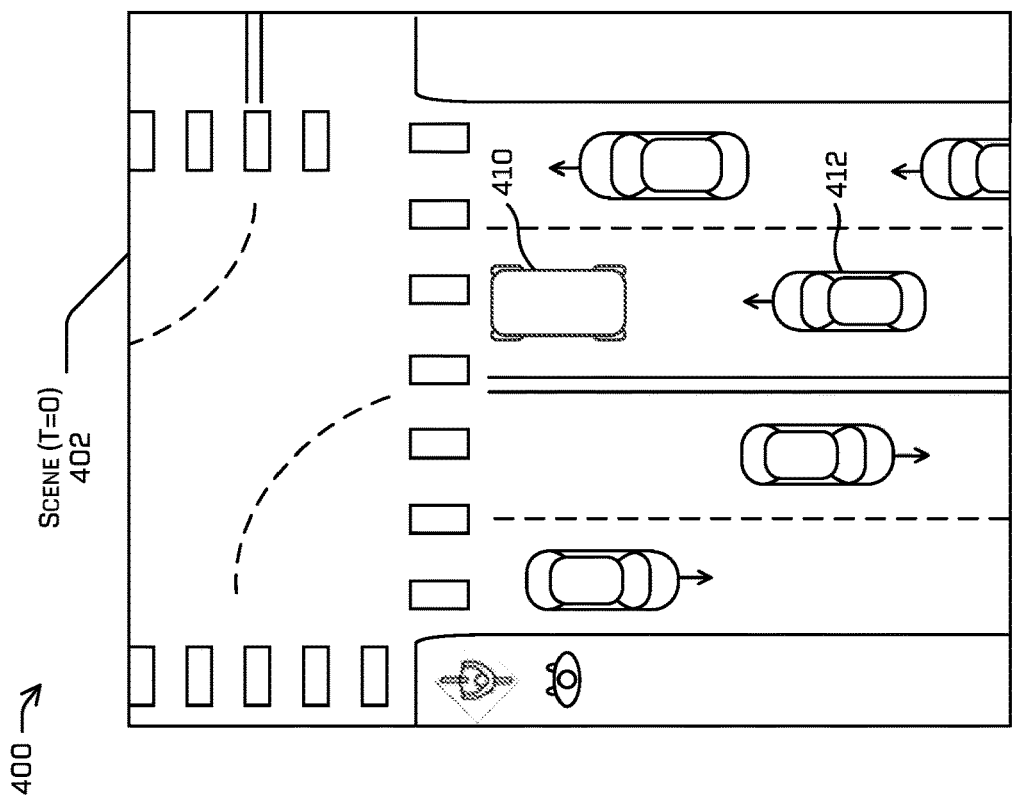
Figure 4D:
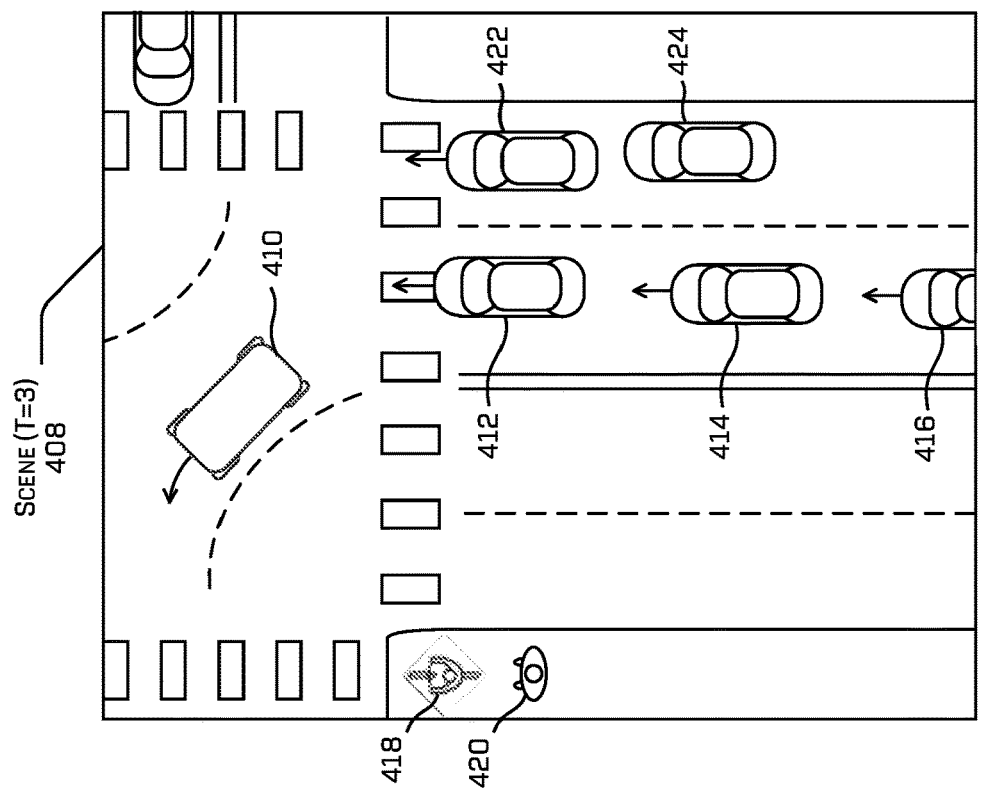
Figure 4C:
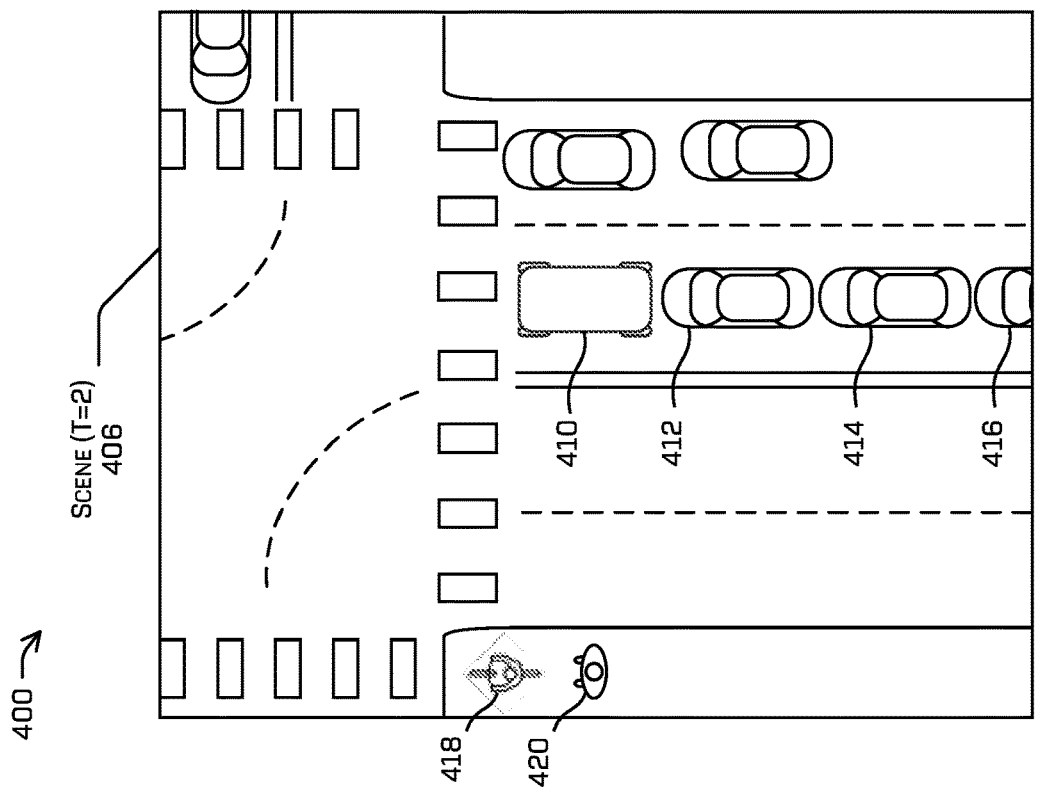

FIGS. 2A-2C illustrate techniques for detecting and analyzing agent interactions within a log-based driving simulation. As described above, in some implementations, the simulation system may covert a playback agent to a smart agent during a driving simulation, based on determining that an interaction occurs within the simulation between the playback agent and a deviating non-playback agents. In this example, FIGS. 2A-2B depict an example of detecting an interaction between two agents within a driving simulation, using the trajectories and bounding boxes associated with the two agents. FIG. 2C determines a deviation distance associated with non-playback agent (e.g., the simulated vehicle or another smart agent), corresponding to the distance between the agent within the driving simulation and the corresponding agent within the log data.

FIGS. 2A and 2B respectively illustrate driving simulations 200 and 218, which may be different simulations or portions of the same simulations. In these examples, the simulation system may be configured to determine interactions representing potential collisions between a simulated vehicle proceeding along a trajectory, and a playback agent proceeding along a different trajectory. Although only two vehicles are discussed in these examples, in other examples the simulation system may similarly analyze the trajectories, paths, bounding box overlaps, and/or perform the other techniques described herein for determining interactions between any two agents within a driving simulation. Such interactions may include interactions between playback agents and simulated vehicles, or between playback agents and smart agents.

As shown in this example, to determine interactions within a driving simulation, the simulation system may determine the positions, trajectories, sizes, and/or spatial regions associated with the vehicles in the driving simulation, and may use the sizes and/or spatial regions along with the vehicle trajectories to determine the possibility or likelihood of an interaction between the vehicles. As shown in FIG. 2A, simulation 200 represents an interaction analysis between a simulated vehicle 202 proceeding along a trajectory 204 and a playback agent 206 proceeding along a trajectory 208. In some examples, the simulation system may determine any number of bounding boxes 210 and 212 associated with the simulated vehicle 202, and additional bounding boxes 214 and 216 associated with the playback agent 206. The simulation system may determine each of the bounding boxes 210-216 based on the dimensions (e.g., length, width, and height) and the shape of the respective vehicles, as well as the trajectories of the respective vehicles and the resulting vehicle orientations.

In some examples, the bounding boxes 210-216 also may include safety buffers in additional the projected orientation region of the respective vehicles. The simulation system may determine the size and shape of any safety buffers to add to the bounding boxes 210, based on the vehicle classifications, velocities, yaws, and/or other attributes of the respective vehicles. For instance, the simulation system may determine the dimensions the bounding boxes 214 and 216 based on the perceived edges (frontmost and backmost points, leftmost and rightmost points) of the playback agent 206, along its perceived trajectory, including an additional safety buffer around the perceived edges of the playback agent 206. In various examples, a larger safety buffer may be used for higher-speed vehicles, more vulnerable vehicles/objects (e.g., bicycles or pedestrians), or for scenarios in which the simulation system has less confidence in the perception data for the size, shape, trajectory or other state parameters of the playback agent 206.

In FIG. 2A, the positions of the simulated vehicle 202 and playback agent 206 may be depicted at a particular (e.g., current) time during the driving simulation, and bounding boxes 210-216 are shown as projections at two time intervals subsequent to the current time. In this example, bounding boxes 210 and 212 are respectively depicted for the simulated vehicle 202 at a first time (t=1) and second time (t=2) after the current time. Similarly, bounding boxes 214 and 216 are respectively depicted for the playback agent 206 at a first time (t=1) and second time (t=2). As shown in this example, the simulation systems also may account for the anticipated vehicle maneuvers (e.g., turns) and the corresponding effect on the orientation and position of the vehicles, when calculating the projected regions for bounding boxes 210-216 at the subsequent times in the simulation.

In some examples, the simulation system may compare the bounding boxes associated with the simulated vehicle 202, and the bounding boxes associated with the playback agent 206 at each time interval to determine whether or not any overlap exists, which may indicate an intersection between the simulated vehicle 202 and the playback agent 206. In this example, the simulation system may compare the size, shape, and location of bounding boxes 210 and 214 to determine that no overlap exists at the first time (t=1), and similarly may compare bounding boxes 212 and 216 to determine that no overlap exists at the second time (t=2). Accordingly, in the example simulation 200 the simulation system may determine that there is no intersection between the simulated vehicle 202 and the playback agent 206.

In contrast, FIG. 2B depicts an interaction analysis of a second simulation 218 between a simulated vehicle 220 proceeding along a trajectory 222, and a playback agent 224 proceeding along a trajectory 226. As in the example above, the simulation system may compare the bounding boxes associated with the simulated vehicle 220, and the bounding boxes associated with the playback agent 224 at each time interval to determine whether or not any overlap exists, which may indicate an intersection between the simulated vehicle 220 and the playback agent 224. In this example, the simulation system may generate a set of bounding boxes 228-230 for the simulated vehicle 220, and another set of bounding boxes 232-234 for the playback agent 224. The simulation system then may compare the size, shape, and location of bounding boxes 228 and 232 to determine whether an overlap exists at the first time (t=1), and similarly may compare bounding boxes 230 and 234 to determine whether an overlap exists at the second time (t=2). As shown in this example, the simulated vehicle 220 in simulation 218 may be driving faster than the simulated vehicle 202 in simulation 200. However, the speed and trajectory of the playback agent 224 may remain the same as the speed and trajectory of the playback agent 206 in simulation 200. As a result, as shown in FIG. 2B, an overlap exists between bounding boxes 230 and 234, indicating an interaction (and a potential collision) between the simulated vehicle 220 and the playback agent 224 in simulation 218.

Although the above example describes determining interaction by projecting bounding boxes at discreet time intervals, the simulation system may implement various other techniques in other examples. For instance, in some cases the simulation system may determine a projected path polygon or freeform corridor for each vehicle simulations 200 and 218, based on the respective trajectories of the vehicles, and may perform a time-space overlap analysis within a potential collision zone determined based on the overlap of the path polygons (or corridors). For example, as described in more detail in U.S. patent application Ser. No. 16/136,038, entitled "Collision Prediction and Avoidance for Vehicles" filed Sep. 19, 2018, the entirety of which is incorporated herein by reference for all purposes, the simulation system may determine a potential collision zone between vehicles based on the point(s) of intersection between the vehicle trajectories, and one or more offset distances associated with the vehicles. The simulation system may determine the offset distances based on the lengths and/or widths of the vehicles, and also may apply a safety buffer or any other distance representative of a safe distance at which the vehicles will not collide. For instance, the simulation system may calculate the offset distance(s) used to define the dimensions of potential collision zone, based on overlap of the projected movement corridors for each vehicle, wherein the measurements are performed for points before and after an intersection point of the trajectories of the vehicles. In various examples, the sizes of the movement corridors may be measured from a center point of each vehicles and/or from the frontmost and backmost point of each vehicle along their trajectories. The simulation system also may account for vehicle maneuvers (e.g., turns) and the corresponding effect on the position of the vehicle, when calculating the offset distances for the potential collision zone.

In some examples, after detecting an interaction between a playback agent (e.g., playback agent 224) and a non-playback agent (e.g., simulated vehicle 220) in a driving simulation, the simulation system may determine a deviation distance for the non-playback agent associated with the interaction. An example of a deviation distance determination is illustrated for the simulation 218 in FIG. 2C. In this example, bounding boxes 230 and 234 are shown depicting the interaction between the simulated vehicle 220 and the playback agent 224 at the second time (t=2) in simulation 218. Additionally, FIG. 2C depicts a position 236 of the simulated vehicle at the second time (t=2), and a position 238 of the corresponding agent vehicle as represented in the log data. As shown in this example, because the functionalities/behaviors of the simulated vehicle 220 differ from those of the corresponding vehicle within the log data, the simulated vehicle 220 is deviated by the deviation distance 240 from its position in the log data. As noted above, simulated vehicles can deviate from the log data based on different versions of the vehicle controller software and/or hardware systems, and smart agents may deviate from the log data based on the decisions of the planning component that diverge from decisions of the driver in the log data. However, in some examples, the behavior of playback agents to navigate through the simulated environment may be solely on the log data, and thus in such examples playback agents might not deviate from their positions in the log data.

As shown in FIG. 2C, the simulation system has determined that the simulated vehicle 220 is deviating, because the position 236 of the simulated vehicle 220 is different from the position 238 of the corresponding vehicle within the log data at the same relative time. In some examples, to determine whether an agent is deviating, the simulation system may compare the deviation distance 240 to a deviation distance threshold (e.g., 0.3 meters), and agents deviating by more than the deviation distance threshold may be determined as deviating agents while agents deviating less than the deviation distance threshold may be determined as non-deviating agents. In some examples, a deviation distance threshold of zero may be used, so that any deviation between the position of the agent and the corresponding log data may be classified by simulation system as a deviating agent.

Additionally, although this example describes determining deviating agents based on the amount of a deviation distance 240, in other examples a determination of a deviating agent may including determine a yaw deviation of the agent and comparing the yaw deviation to a yaw deviation threshold. Deviation thresholds for distance, yaw, and/or other attributes of the agent (e.g., velocity, trajectory, etc.) may be predetermined and fixed threshold values in some cases. In other cases, the simulation system may use different deviation thresholds for agents based on velocity, and/or for different types of agents. For instance, pedestrian agents, bicycle agents, car agents, truck agents, etc., each may have different distance and/or yaw deviation thresholds to determine which the agents are considered to be deviating agents.

FIGS. 3A-3D depict four different scenes within a log-based driving simulation 300. The four scenes depicted in FIGS. 3A-3D may represent the same driving simulation 300 at four different times: scene 302 (FIG. 3A) may represent the state of the simulation 300 at a first time (t=0), scene 304 (FIG. 3B) may represent the state of the simulation 300 at a second time (t=1), scene 306 (FIG. 3C) may represent the state of the simulation 300 at a third time (t=2), and scene 308 (FIG. 3D) may represent the state of the simulation 300 at a fourth time (t=3). The simulation 300 includes a simulated vehicle 310 driving within a simulated environment including a number of additional agents and other objects. As described below in reference to the individual scenes 302-308, the simulated vehicle 310 in this example does not interact with any of the playback agents in the simulation 300, and thus simulation 300 does not result in any conversions of the playback agents to smart agents.

As shown in scene 302, the simulated vehicle 310 is stopped at a crosswalk before an intersection, in a simulated environment including a number of additional agents and other objects. Playback agent 312 is the vehicle directly behind the simulated vehicle 310, and is approaching the intersection moving toward the simulated vehicle 310.

In scene 304, the playback agent 312 has stopped directly behind the simulated vehicle 310, and a second playback agent 314 is approaching the playback agent 312 from behind as it approaches the intersection.

In scene 306, the simulated vehicle 310 and playback agent 312 remain stopped at the intersection, and the additional playback agents 314 and 316 have also stopped in line behind the playback agent 312 at the intersection. The agents 310-318 within scene 306 may be waiting at the intersection, for example, at a stop sign, for a traffic light to change, for a break in the cross traffic, for a pedestrian to cross the crosswalk, etc. Additionally, a bicycle playback agent 318 and pedestrian playback agent 320 are shown in scene 306, also waiting to cross the intersection in the northbound direction.

In scene 308, the simulated vehicle 310 has begun moving and is performing a left turn at the intersection. The playback agents 312, 314, and 316 are also moving forward toward the intersection, and the bicycle playback agent 318 and pedestrian playback agent 320 are moving forward to cross the street in the northbound direction.

During simulation 300, the simulated vehicle 310 does not interact with any of the playback agents 312-320, and as a result, none of the playback agents 312-320 (or any of the other agents depicted in the simulation) are converted to smart agents. In some cases, simulation 300 may represent a simulation in which the simulated vehicle 310 does not deviate significantly (or at all) from the driving path/behavior of the corresponding vehicle within the log data upon which the simulation 300 is based. In other cases, the simulated vehicle 310 may deviate from the corresponding vehicle in the log data, but might not deviate sufficiently or such a way as to cause an interaction with any of the playback agents 312-320 in the simulation 300.

FIGS. 4A-4D depict four different scenes within another driving simulation 400 similar to driving simulation 300 describe above. For example, driving simulation 400 may be based on the same log data as driving simulation 300, and may include the same simulated environment, the same simulated objects, and the same initial set of playback agents. However, as described below in reference to the individual scenes 402-408, the simulated vehicle 410 in this example behaves differently than the simulated vehicle 310 in simulation 300. The differences in behavior of the simulated vehicle 410 result in interactions with playback agents, which cause the simulation system to perform a cascading sequence of conversions of the playback agents into smart agents.

As shown in scene 402, the simulated vehicle 410 is stopped at the same crosswalk before the same intersection shown in simulation 300. However, the simulated vehicle 410 in this example has stopped a few feet before the simulated vehicle 310 in the previous example. Unlike simulated vehicle 310, the simulated vehicle 410 in this example has stopped entirely before the crosswalk in front of the intersection. Playback agent 412 is the vehicle directly behind the simulated vehicle 410, and is approaching the intersection moving toward the simulated vehicle 410.

In scene 404, the playback agent 412 followed the same path as the playback agent 312 in the previous example. However, because the simulated vehicle 410 stopped a few feet earlier than in the previous example, the simulation system has determined that an interaction will result between the playback agent 412 and the deviating simulated vehicle 410. The interaction in this example is a potential rear-end collision between the playback agent 412 and the simulated vehicle 410 which has deviated by stopping earlier at the intersection. As a result, to prevent the potential collision, the simulation system has converted agent 412 to a smart agent, and as depicted in scene 404, and the smart agent 412 has used a planning component to identify the potential collision with the simulated vehicle 410 and has braked earlier at the intersection to avoid the potential collision.

In scene 406, the simulated vehicle 410 and smart agent 412 remain stopped at the intersection. As a result of the smart agent 412 braking earlier at the intersection, the simulation system has determined that another interaction (e.g., potential rear-end collision) will result between the playback agent 414 and the now-deviating smart agent 412. In response, the simulation system has also converted agent 414 to a smart agent, and the smart agent 414 has braked earlier at the intersection to avoid the potential collision with the smart agent 412. Then, after converting agent 414 to a smart agent, the simulation system also determines that another interaction will result between the playback agent 416 and the now-deviating smart agent 414. Accordingly, the simulation system converts the agent 416 to a smart agent, and the smart agent 416 brakes earlier at the intersection to avoid the potential collision with the smart agent 414.

In scene 408, the simulated vehicle 410 has begun moving and is performing a left turn at the intersection. The agents 412, 414, and 416, which have been converted to smart agents, are also moving forward toward the intersection. However, unlike in simulation 300, the bicycle agent 418 and pedestrian agent 320 have also been converted to smart agents in this example. For instance, due to the simulated vehicle 410 stopping farther back at the intersection and/or accelerating more slowly in scene 408, the playback trajectory and speed of the bicycle playback agent 418 would cause an interaction with the slower simulated vehicle 410 at the western crosswalk of the interaction just after the scene 408. As a result of the simulated vehicle 410 arriving at the crosswalk later than the corresponding vehicle in the log data, the simulation system has determined that an interaction (e.g., potential bicycle-vehicle collision) will result between the bicycle playback agent 418 and the deviating simulated vehicle 410. In response, the simulation system has also converted the bicycle agent 418 to a smart bicycle agent, and the smart bicycle agent 418 has yield at the crosswalk in scene 408, to allow the simulated vehicle 410 to proceed through the intersection before crossing. Then, after converting bicycle agent 418 to a smart bicycle agent, the simulation system also determines that another interaction will result between the pedestrian agent 420 and the now-deviating smart bicycle agent 418. Accordingly, the simulation system converts the pedestrian agent 420 to a smart pedestrian agent, and the smart pedestrian agent 420 does not begin walking at scene 408 because the smart bicycle agent remains directly in front of the smart pedestrian agent 420.

As illustrated by simulation 400, in contrast to the similar simulation 300, when simulation system converts a first playback agent to a smart agent, based on a determination of an interaction between the first playback agent and a deviating agent (e.g., simulated vehicle or smart agent), the conversion allows the smart agent to use a planning component and control its path independently within the simulation to prevent the interaction. However, after the first playback agent has been converted to a smart agent, it may deviate from the behavior of its corresponding agent in the log data, which may result in the smart agent interacting with additional playback agents as the driving simulation continues. These additional interactions with the now-deviating smart agent may cause the simulation system to convert the additional playback agents into smart agents, and the result may be a cascading effect of converting playback agents to smart agents during the execution of the driving simulation.

Figure 5:
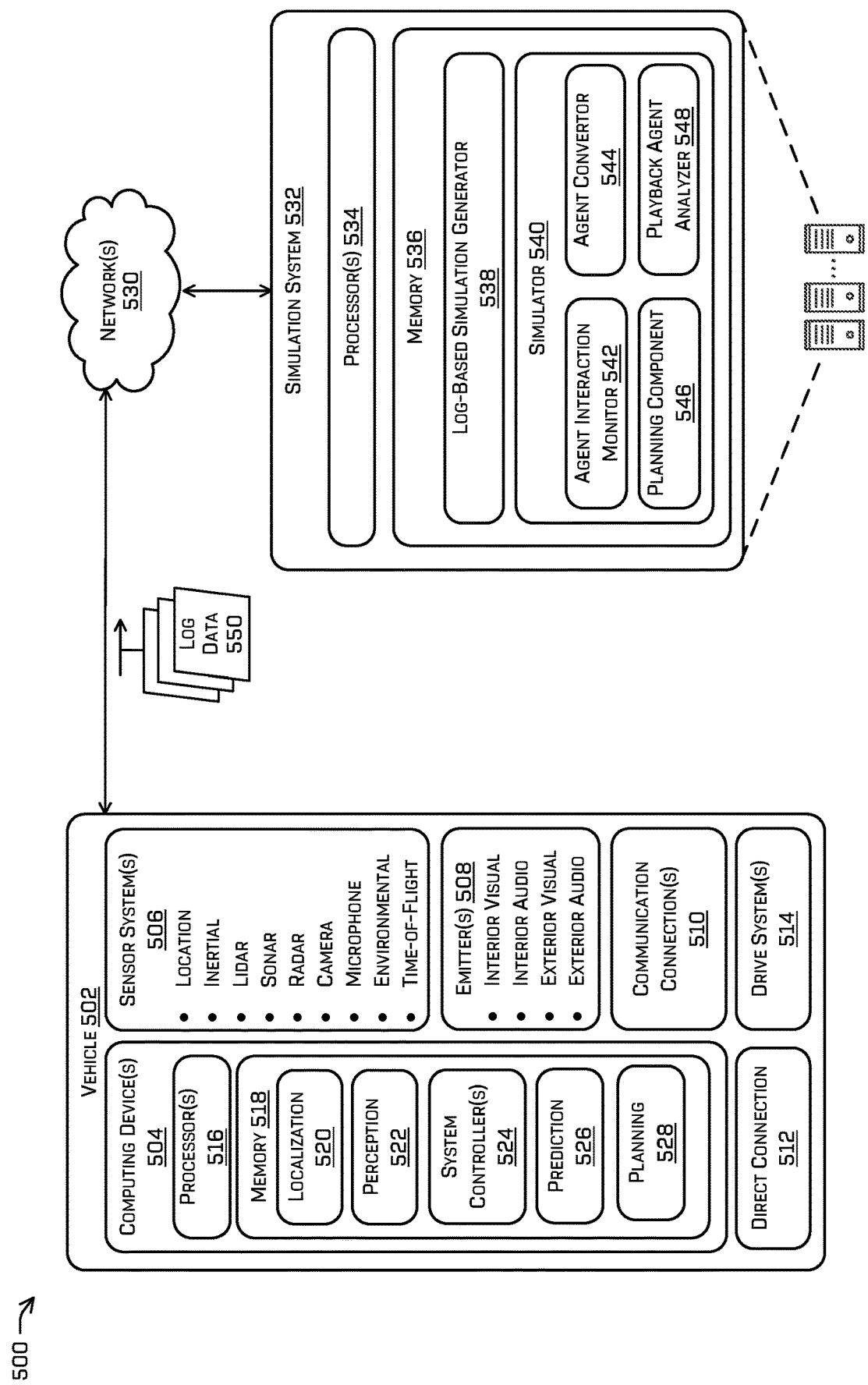
FIG. 5 illustrates a block diagram of a computing environment including a vehicle and a simulation system, in accordance with one or more implementations of the disclosure.

FIG. 5 illustrates an example computing environment 500 that may be used to implement the driving simulation systems and techniques described herein. In this computing environment 500 includes a vehicle 502 and a simulation system 532 configured to generate and execute log-based driving simulations. The vehicle 502 may include various software-based and/or hardware-based components of an autonomous vehicle, and may be used to control autonomous vehicles traversing through physical environments and/or simulated vehicles operating within log-based driving simulations. The vehicle 502 may be similar or identical to any or all of the real and/or simulated vehicles or vehicle controllers described herein. In some examples, the vehicle 502 may correspond to a vehicle traversing a physical environment, capturing and storing log data which may be provided to the simulation system 532 and used to generate a log-based simulation. Additionally or alternatively, the vehicle 502 may operate as one or more separate vehicle control systems, interacting with and being evaluated by the simulation system 532 during a log-based driving simulation.

In at least one example, the vehicle 502 may correspond to an autonomous or semi-autonomous vehicle configured to perform object perception and prediction functionality, route planning and/or optimization. The example vehicle 502 can be a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such examples, because the vehicle 502 can be configured to control all functions from start to completion of the trip, including all parking functions, it may not include a driver and/or controls for driving the vehicle 502, such as a steering wheel, an acceleration pedal, and/or a brake pedal. This is merely an example, and the systems and methods described herein may be incorporated into any ground-borne, airborne, or waterborne vehicle, including those ranging from vehicles that need to be manually controlled by a driver at all times, to those that are partially or fully autonomously controlled.

In this example, the vehicle 502 can include vehicle computing device(s) 504, one or more sensor systems 506, one or more emitters 508, one or more communication connections 510, at least one direct connection 512, and one or more drive systems 514.

The vehicle computing device(s) 504 can include one or more processors 516 and memory 518 communicatively coupled with the one or more processors 516. In the illustrated example, the vehicle 502 is an autonomous vehicle; however, the vehicle 502 could be any other type of vehicle or robotic platform. In the illustrated example, the memory 518 of the vehicle computing device(s) 504 stores a localization component 520, a perception component 522, one or more system controllers 524, a prediction component 526, and a planning component 528. Though depicted in FIG. 5 as residing in the memory 518 for illustrative purposes, one or more of the localization component 520, the perception component 522, the system controllers 524, the prediction component 526, and the planning component 528 can additionally, or alternatively, be accessible to the vehicle 502 (e.g., stored on, or otherwise accessible by, memory remote from the vehicle 502).

In at least one example, the localization component 520 can include functionality to receive data from the sensor system(s) 506 to determine a position and/or orientation of the vehicle 502 (e.g., one or more of an x-, y-, z-position, roll, pitch, or yaw). For example, the localization component 520 can include and/or request/receive a map of an environment and can continuously determine a location and/or orientation of the autonomous vehicle within the map. In some instances, the localization component 520 can utilize SLAM (simultaneous localization and mapping), CLAMS (calibration, localization and mapping, simultaneously), relative SLAM, bundle adjustment, non-linear least squares optimization, or the like to receive image data, lidar data, radar data, time of flight data, IMU data, GPS data, wheel encoder data, and the like to accurately determine a location of the autonomous vehicle. In some instances, the localization component 520 can provide data to various components of the vehicle 502 to determine an initial position of an autonomous vehicle for generating a trajectory and/or for determining that an object is proximate to one or more crosswalk regions and/or for identifying candidate reference lines, as discussed herein.

In some instances, and in general, the perception component 522 can include functionality to perform object detection, segmentation, and/or classification. In some examples, the perception component 522 can provide processed sensor data that indicates a presence of an entity that is proximate to the vehicle 502 and/or a classification of the entity as an entity type (e.g., car, pedestrian, cyclist, animal, building, tree, road surface, curb, sidewalk, stoplight, stop sign, unknown, etc.). In additional or alternative examples, the perception component 522 can provide processed sensor data that indicates one or more characteristics associated with a detected entity (e.g., a tracked object) and/or the environment in which the entity is positioned. In some examples, characteristics associated with an entity can include, but are not limited to, an x-position (global and/or local position), a y-position (global and/or local position), a z-position (global and/or local position), an orientation (e.g., a roll, pitch, yaw), an entity type (e.g., a classification), a velocity of the entity, an acceleration of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

In some examples, the memory 518 can include one or more maps that can be used by the vehicle 502 to navigate within the environment. For the purpose of this disclosure, a map can be any number of data structures modeled in two dimensions, three dimensions, or N-dimensions that are capable of providing information about an environment, such as, but not limited to, topologies (such as intersections), streets, mountain ranges, roads, terrain, and the environment in general. In some instances, a map can include, but is not limited to: texture information (e.g., color information (e.g., RGB color information, Lab color information, HSV/HSL color information), and the like), intensity information (e.g., lidar information, radar information, and the like); spatial information (e.g., image data projected onto a mesh, individual "surfels" (e.g., polygons associated with individual color and/or intensity)), reflectivity information (e.g., specularity information, retroreflectivity information, BRDF information, BSSRDF information, and the like). In one example, a map can include a three-dimensional mesh of the environment. In some instances, the map can be stored in a tiled format, such that individual tiles of the map represent a discrete portion of an environment, and can be loaded into working memory as needed.

In some examples, the vehicle 502 can be controlled based at least in part on the maps. That is, the maps can be used in connection with the localization component 520, the perception component 522, the prediction component 526, and/or the planning component 528 to determine a location of the vehicle 502, identify objects in an environment, and/or generate routes and/or trajectories to navigate within an environment.

In at least one example, the vehicle computing device(s) 504 can include one or more system controllers 524, which can be configured to control steering, propulsion, braking, safety, emitters, communication, and other systems of the vehicle 502. The system controller(s) 524 can communicate with and/or control corresponding systems of the drive system(s) 514 and/or other components of the vehicle 502.

In general, the prediction component 526 can include functionality to generate predicted information associated with objects in an environment. As an example, the prediction component 526 can be implemented to predict locations of a pedestrian proximate to a crosswalk region (or otherwise a region or location associated with a pedestrian crossing a road) in an environment as they traverse or prepare to traverse through the crosswalk region. As another example, the techniques discussed herein can be implemented to predict locations of other objects (e.g., vehicles, bicycles, pedestrians, and the like) as the vehicle 502 traverses an environment. In some examples, the prediction component 526 can generate one or more predicted positions, predicted velocities, predicted trajectories, etc., for such target objects based on attributes of the target object and/or other objects proximate the target object.

In general, the planning component 528 can determine a path for the vehicle 502 to follow to traverse the environment. For example, the planning component 528 can determine various routes and trajectories and various levels of detail. For example, the planning component 528 can determine a route to travel from a first location (e.g., a current location) to a second location (e.g., a target location). For the purpose of this discussion, a route can be a sequence of waypoints for travelling between two locations. As non-limiting examples, waypoints include streets, intersections, global positioning system (GPS) coordinates, etc. Further, the planning component 528 can generate an instruction for guiding the autonomous vehicle along at least a portion of the route from the first location to the second location. In at least one example, the planning component 528 can determine how to guide the autonomous vehicle from a first waypoint in the sequence of waypoints to a second waypoint in the sequence of waypoints. In some examples, the instruction can be a trajectory, or a portion of a trajectory. In some examples, multiple trajectories can be substantially simultaneously generated (e.g., within technical tolerances) in accordance with a receding horizon technique, wherein one of the multiple trajectories is selected for the vehicle 502 to navigate.

In some instances, the planning component 528 can generate one or more trajectories for the vehicle 502 based at least in part on predicted location(s) associated with object(s) in an environment. In some examples, the planning component 528 can use temporal logic, such as linear temporal logic and/or signal temporal logic, to evaluate one or more trajectories of the vehicle 502.

As can be understood, the components discussed herein (e.g., the localization component 520, the perception component 522, the one or more system controllers 524, the prediction component 526, and the planning component 528 are described as divided for illustrative purposes. However, the operations performed by the various components can be combined or performed in any other component. Further, any of the components discussed as being implemented in software can be implemented in hardware, and vice versa. Further, any functionality implemented in the vehicle 502 can be implemented in one or more remoted computing device(s) (e.g., simulation system 532), or another component (and vice versa).

In at least one example, the sensor system(s) 506 can include time of flight sensors, lidar sensors, radar sensors, ultrasonic transducers, sonar sensors, location sensors (e.g., GPS, compass, etc.), inertial sensors (e.g., inertial measurement units (IMUs), accelerometers, magnetometers, gyroscopes, etc.), cameras (e.g., RGB, IR, intensity, depth, etc.), microphones, wheel encoders, environment sensors (e.g., temperature sensors, humidity sensors, light sensors, pressure sensors, etc.), etc. The sensor system(s) 506 can include multiple instances of each of these or other types of sensors. For instance, the time of flight sensors can include individual time of flight sensors located at the corners, front, back, sides, and/or top of the vehicle 502. As another example, the camera sensors can include multiple cameras disposed at various locations about the exterior and/or interior of the vehicle 502. The sensor system(s) 506 can provide input to the vehicle computing device(s) 504. Additionally or alternatively, the sensor system(s) 506 can send sensor data, via the one or more networks 530, to the one or more external computing device(s) at a particular frequency, after a lapse of a predetermined period of time, in near real-time, etc.

The vehicle 502 can also include one or more emitters 508 for emitting light and/or sound, as described above. The emitters 508 in this example include interior audio and visual emitters to communicate with passengers of the vehicle 502. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The emitters 508 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which comprising acoustic beam steering technology.

The vehicle 502 can also include one or more communication connection(s) 510 that enable communication between the vehicle 502 and one or more other local or remote computing device(s). For instance, the communication connection(s) 510 can facilitate communication with other local computing device(s) on the vehicle 502 and/or the drive system(s) 514. Also, the communication connection(s) 510 can allow the vehicle to communicate with other nearby computing device(s) (e.g., other nearby vehicles, traffic signals, etc.). The communications connection(s) 510 also enable the vehicle 502 to communicate with a remote teleoperations computing device or other remote services.

The communications connection(s) 510 can include physical and/or logical interfaces for connecting the vehicle computing device(s) 504 to another computing device or a network, such as network(s) 530. For example, the communications connection(s) 510 can enable Wi-Fi-based communication such as via frequencies defined by the IEEE 802.11 standards, short range wireless frequencies such as Bluetooth®, cellular communication (e.g., 2G, 3G, 4G, 4G LTE, 5G, etc.) or any suitable wired or wireless communications protocol that enables the respective computing device to interface with the other computing device(s).

In at least one example, the vehicle 502 can include one or more drive systems 514. In some examples, the vehicle 502 can have a single drive system 514. In at least one example, if the vehicle 502 has multiple drive systems 514, individual drive systems 514 can be positioned on opposite ends of the vehicle 502 (e.g., the front and the rear, etc.). In at least one example, the drive system(s) 514 can include one or more sensor systems to detect conditions of the drive system(s) 514 and/or the surroundings of the vehicle 502. By way of example and not limitation, the sensor system(s) can include one or more wheel encoders (e.g., rotary encoders) to sense rotation of the wheels of the drive modules, inertial sensors (e.g., inertial measurement units, accelerometers, gyroscopes, magnetometers, etc.) to measure orientation and acceleration of the drive module, cameras or other image sensors, ultrasonic sensors to acoustically detect objects in the surroundings of the drive system, lidar sensors, radar sensors, etc. Some sensors, such as the wheel encoders can be unique to the drive system(s) 514. In some cases, the sensor system(s) on the drive system(s) 514 can overlap or supplement corresponding systems of the vehicle 502 (e.g., sensor system(s) 506).

The drive system(s) 514 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 514 can include a drive system controller which can receive and preprocess data from the sensor system(s) and to control operation of the various vehicle systems. In some examples, the drive system controller can include one or more processors and memory communicatively coupled with the one or more processors. The memory can store one or more components to perform various functionalities of the drive system(s) 514. Furthermore, the drive system(s) 514 also include one or more communication connection(s) that enable communication by the respective drive system with one or more other local or remote computing device(s).

In at least one example, the direct connection 512 can provide a physical interface to couple the one or more drive system(s) 514 with the body of the vehicle 502. For example, the direct connection 512 can allow the transfer of energy, fluids, air, data, etc. between the drive system(s) 514 and the vehicle. In some instances, the direct connection 512 can further releasably secure the drive system(s) 514 to the body of the vehicle 502.

In at least one example, the localization component 520, the perception component 522, the one or more system controllers 524, the prediction component 526, and the planning component 528 can process sensor data, as described above, and can send their respective outputs, over the one or more network(s) 530, to one or more external computing device(s), such as the simulation system 532. In at least one example, the respective outputs of the components can be transmitted to the simulation system 532 at a particular frequency, after a lapse of a predetermined period of time, in near real-time, etc. Additionally or alternatively, the vehicle 502 can send sensor data to the simulation system 532 via the network(s) 530, including raw sensor data, processed sensor data and/or representations of sensor data. Such sensor data can be sent as one or more files of log data 550 to the simulation system 532 at a particular frequency, after a lapse of a predetermined period of time, in near real-time, etc.

As discussed above, the simulation system 532 may generate and execute driving simulations, such as log-based driving simulations, using the various components and systems described herein to perform techniques similar or identical to those described above in reference to FIGS. 1-4D and below in reference to processes 600 and 700. The simulation system 532 may communicate/interact with one or more vehicles 502 to perform driving simulations in which the vehicles 502 correspond to the simulated vehicle. Although not shown in this example, the simulation system 532 also may include log data store(s) and/or simulation scenarios including simulated environments and objects. In various examples, the simulation system 732 may generate, instantiate, and execute driving simulations for simulated vehicles, including monitoring and receiving responses based on the simulations from vehicles 502 and/or other vehicle control systems.

Simulation system 532 may include one or more processors 534 and memory 536 communicatively coupled with the one or more processors 534. In the illustrated example, the memory 536 of the simulation system 532 stores a log-based simulation generator 538 and a simulator 540 configured to execute log-based driving simulations. The simulator 540 includes an agent interaction monitor 542, an agent convertor 544, a planning component 546, and playback agent analyzer 548. In this example, the agent interaction monitor 542 may include the functionality described herein for tracking agents and simulated vehicles during log-based simulations, generating bounding boxes, and determining interactions between agents during the simulations. The agent convertor 544 may include the functionality described herein for converter playback agents to smart agents during log-based driving simulations. The planning component 546 may include the functionality described herein for providing planning component functionality for smart agents during driving simulations. For instance, a function, thread, or process may be initiated within the planning component 546 for each smart agent conversion during a simulation, to analyze the simulated environment and determine a path for the smart agent through the simulated environment. In some examples, the planning component 546 may be a simplified version of the planning component 528 configured to avoid interactions with minimal trajectory adjustments by the smart agents. The playback agent analyzer 548 may include the functionality described herein for analyzing the route taken by playback agents, the vehicle state, and the driving operations performed by playback agents to determine one or more driving styles and/or driver personality types for the playback agents. Though depicted in FIG. 5 as residing in the memory 536 for illustrative purposes, it is contemplated that some or all of the systems and components 538-548 may additionally, or alternatively, be stored remotely and accessible to the simulation system 532 through networks 530.

The log-based simulation generator 538 may generate log-based driving simulations using similar or identical techniques to those described herein. For example, the log-based simulation generator 538 may receive log data previously collected a vehicle 502 and/or other vehicle control systems. The log data may correspond to data captured by a vehicle 502 traversing through a physical environment. To generate a log-based driving simulation, the log-based simulation generator 538 may use the received log data to generate simulation instructions that, when executed by the simulator 540, generate the simulated environment and simulated objects (e.g., agents). During the execution of a log-based simulation, the simulator 540 may provide simulated environment and object data, based on the log data, to a simulated vehicle (e.g., vehicle 502). For instance, the log-based simulation generator 538 may receive and analyze the log data to detect specific objects within an environment, and the attribute data associated those objects (e.g., sizes, positions, trajectories, waypoints, etc.), and the simulator 540 may convert the object data into sensor data that may be transmitted to the vehicle 502 during execution of the driving simulation.

In some instances, the log-based simulation generator 538 may determine that a particular object has a characteristic and apply that characteristic to the simulated object. For purposes of illustration only, the log data can indicate that an object travels at approximately 10 mph below the speed limit and accelerates slowly. The log-based simulation generator 538 may determine that the object is a cautious vehicle and apply a cautious object model to the corresponding simulated object in the simulated environment. In some instances, the log-based simulation generator 538 may determine, based on behavior data in the log data, that an object as an aggressive object, a passive object, a neutral object, and/or other types of behaviors and apply behavior instructions associated with the behavior (e.g., a passive behavior, a cautious behavior, a neutral behavior, and/or an aggressive behavior) to the simulated object.

In some instances, the simulator 540 can use filters to remove objects represented in the log data from a simulated scenario based on attributes associated with the objects. In some instances, the simulator 540 can filter objects based on an object/classification type (car, pedestrian, motorcycle, bicyclist, etc.), an object size (e.g., length, width, height, and/or volume), a confidence level, track length, an amount of interaction between the object and a vehicle generating the log data, and/or a time period.

By way of example and without limitation, the log data can include objects of varying sizes such as mailboxes and buildings. The log-based simulation generator 538 can use a volume-based filter such that objects that are associated with a volume greater equal to or greater than a threshold volume of three cubic meters, such as buildings, are represented in the simulated scenario and objects that are associated with a volume less than three cubic meters are not represented in the simulated scenario, such as the mailboxes. In some instances, the log-based simulation generator 538 can use a track length filter where objects that have track lengths (e.g., data associated with a physical distance or a period of time) that do not meet or exceed a track length threshold are filtered from the simulated scenario. This can result in a simulation that omits objects associated with poor detections during the time of data capture. In some instances, the log-based simulation generator 538 can use a motion-based filter such that objects associated with motion or a trajectory according to the log data are represented in the simulation. In some instances, the filters can be applied in combination or mutually exclusively.

In some instances, the log-based simulation generator 538 can filter objects that do not meet or exceed a confidence threshold. By way of example and without limitation, the log data can indicate that an object is associated with a classification attribute of a pedestrian and a confidence value of associated with the classification of 5%. The log-based simulation generator 538 can have a confidence value threshold of 75% and filter the object based on the confidence value not meeting or exceeding the confidence value threshold. In some instances, a user can provide a user-generated filter that includes one or more attribute thresholds such that the log-based simulation generator 538 can filter objects that do not meet or exceed the one or more attribute thresholds indicated by the user-generated filter.

The simulator 540 can execute the driving simulation as a set of simulation instructions and generate simulation data. In some instances, the simulator 540 can execute multiple simulated scenarios simultaneously and/or in parallel. This can allow a user to edit a simulation and execute permutations of the simulation with variations between each simulation. Additionally, the simulator 540 can determine an outcome for the simulation. For example, the simulator 540 can execute the log-based driving simulation for use in a simulation for testing and validation. The simulator 540 can generate the simulation data indicating how the vehicle 502 performed (e.g., responded) and can compare the simulation data to a predetermined outcome and/or determine if any predetermined rules/assertions were broken/triggered.

In some instances, the predetermined rules/assertions can be based on the simulation (e.g., traffic rules regarding crosswalks can be enabled based on a crosswalk scenario or traffic rules regarding crossing a lane marker can be disabled for a stalled vehicle scenario). In some instances, the simulator 540 can enable and disable rules/assertions dynamically as the simulation progresses. For example, as a simulated object approaches a school zone, rules/assertions related to school zones can be enabled and disabled as the simulated object departs from the school zone. In some instances, the rules/assertions can include comfort metrics that relate to, for example, how quickly an object can accelerate given the simulated scenario.

Based at least in part on determining that the vehicle 502 performed consistent with the predetermined outcome (that is, the autonomous controller did everything it was supposed to do) and/or determining that a rule was not broken or an assertion was not triggered, the simulator 540 can determine that the vehicle 502 succeeded. Based at least in part on determining that the vehicle 502 performance was inconsistent with the predetermined outcome (that is, the autonomous controller did something that it wasn't supposed to do) and/or determining that a rule was broken or than an assertion was triggered, the simulator 540 can determine that the vehicle 502 failed. Accordingly, based at least in part on executing the simulation, simulation data can indicate how the vehicle 502 responds to each simulation, as described above and determine a successful outcome or an unsuccessful outcome based at least in part on the simulation data.

The processor(s) 516 of the vehicle 502 and the processor(s) 534 of the simulation system 532 can be any suitable processor capable of executing instructions to process data and perform operations as described herein. By way of example and not limitation, the processor(s) 516 and 534 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

Memory 518 and 536 are examples of non-transitory computer-readable media. The memory 518 and 536 can store an operating system and one or more software applications, instructions, programs, and/or data to implement the methods described herein and the functions attributed to the various systems. In various implementations, the memory can be implemented using any suitable memory technology, such as static random access memory (SRAM), synchronous dynamic RAM (SDRAM), nonvolatile/Flash-type memory, or any other type of memory capable of storing information.

The architectures, systems, and individual elements described herein can include many other logical, programmatic, and physical components, of which those shown in the accompanying figures are merely examples that are related to the discussion herein.

It should be noted that while FIG. 5 is illustrated as a distributed system, in alternative examples, components of the vehicle 502 can be associated with the simulation system 532 and/or components of the simulation system 532 can be associated with the vehicle 502. That is, the vehicle 502 can perform one or more of the functions associated with the simulation system 532, and vice versa. Further, aspects of the simulator 540 (and subcomponents thereof) can be performed on any of the devices or systems discussed herein.

As noted above, the simulation system 532 may analyze the log data 550 received from vehicle(s) 502 to determine behaviors, attributes, and/or destinations associated with the vehicles and other objects represented in the log data. In some examples, the simulation system 532 may use the behaviors, attributes, and/or destinations of objects in the log data to determine corresponding behaviors, attributes, and/or destinations for the smart agents in a simulation. For instance, the playback agent analyzer 548 may analyze the log data 550 to identify one or more behaviors performed by any dynamic object(s) in the environment, including motorized vehicle objects, non-motorized vehicle objects (e.g., bicycles, skateboards, etc.) and/or pedestrian objects. Based on the object classifications and the object behaviors determined from the log data, the playback agent analyzer 548 may determine attributes associated the with objects (e.g., driving attributes, personality attributes, or other behavior attributes). The planning component(s) 546 then may use the object attributes determined by the playback agent analyzer 548 to control smart agents within simulations, thereby providing more realistic agent behaviors and decision-making, and improving the overall quality and value of simulations.

The behaviors determined by the playback agent analyzer 548 based on the log data may include any observable action performed (or not performed) by an object in the environment. Behaviors may be represented as binary values and/or numeric values that quantify the behavior performed by the object. In certain examples, a number of different values for attributes can be recorded for a specific agent. The values of the attributes may correspond to a behavior for a certain agent. For example, specific ranges of attributes can correspond to a specific behavior or values of attributes can be aggregated and/or scaled to correspond to a specific behavior. In some examples, the playback agent analyzer 548 may determine different types of behaviors for different classifications of objects, such as one set of behaviors for motor vehicle objects, another set of behaviors for bicycles, another set of behaviors for pedestrians, etc. Various examples of the types of behaviors and/or attributes that may be determined by the playback agent analyzer 548 are described in the sections below for different object classifications. It can be understood from the context of this disclosure that the behaviors and attributes described herein are non-limiting examples, and that any additional types of object behaviors and attributes may be used in other examples.

For each motor vehicle (e.g., car, truck, bus, motorcycle, etc.) represented in the log data 550, the playback agent analyzer 548 may determine various different driving behaviors based on the vehicle positions, trajectories, velocities, poses, and/or other vehicle attributes captured in the log data 550 associated with the vehicle. Examples of driving behaviors determined from the log data 550 for a vehicle may include the speed of the vehicle relative to the speed limit, the stopping distance of the vehicle with respect to a stopping line (e.g., stop sign, traffic light, crosswalk, etc.). Additional examples of driving behaviors may include whether or not the vehicle drives in bike lanes, bus lanes, or taxi lanes, whether or not the vehicle uses lane splitting or lane sharing, and whether or not the vehicle drives in a shoulder or parking lane. Other examples of driving behaviors may include any traffic violations performed by a vehicle. Other examples of driving behaviors may include comfort parameters such the average (or preferred) acceleration and braking of the vehicle, the maximum acceleration and braking of the vehicle, an average (or preferred) cruising speed of the vehicle, a maximum and minimum cruising speed of the vehicle, and an average and/or maximum tolerable jerkiness metric of the vehicle. Additional driving behaviors may include a reaction time observed for the vehicle in response to a potential interaction, or an estimated trajectory scanning distance (e.g., how far the vehicle scans ahead for interactions). Another driving behavior may include a stopping delay time for the vehicle while at a stop sign or crosswalk until the vehicle resumes moving. Another driving behavior may include a slow speed tolerance parameter, corresponding to the speed of the agent in front of vehicle that causes to vehicle to change lanes or pass the agent. Additional driving behaviors may include signaling parameters for the vehicle, such as whether the vehicle uses a turn signal before turning at a junction, the distance before the junction that the vehicle uses the turn signal, whether the vehicle uses a turn signal before changing lanes, and the distance before a lane change that the vehicle uses the turn signal.

For pedestrians and/or other non-motor vehicle objects (e.g., bicycles, skateboards, etc.) represented in the log data 550, the playback agent analyzer 548 may use the positions, trajectories, velocities, poses, and/or other attributes of the objects determine any of the same behaviors described above for motor vehicles. Additionally and alternatively, the playback agent analyzer 548 may determine different sets of behaviors for objects in the environment based on the object classifications. Examples of behaviors for determined from the log data 550 for non-motor vehicle objects may include the desired (or normal) speed and the maximum speed for the object (e.g., walking speeds, biking speeds, etc.), and the normal and maximum acceleration and deceleration rates for the object. Additional behaviors for non-motor vehicle objects may include the normal speeds and accelerations of the object when crossing a street and/or when jaywalking. Other examples of behaviors for non-motor vehicle objects may include the normal and maximum turning speed for the object, and the distances maintained by the object between itself and streets, walls, or other moving objects (e.g., safety regions, following distances).

For each driving behavior determined for a vehicle, or other behavior determined for a non-motor vehicle object, the playback agent analyzer 548 may determine individual instances of the behavior, averages, ranges, and/or distributions. As an example, the playback agent analyzer 548 may determine as a behavior a vehicle stopping in a crosswalk based on a single instance of the vehicle stopping in a crosswalk from the log data 550. In other examples, the playback agent analyzer 548 may identify multiple instances of a behavior (e.g., a driving speed measurement, a following distance measurement, an acceleration rate value, a braking rate value, etc.), and the driving behavior may correspond to an average of the instances, a range of the instances, or a probability distribution based on the instances. For example, for a driving behavior representing the speed of a vehicle relative to the speed limit, the following distance of the vehicle, etc., the driving behavior may be calculated as an average or a distribution based on the instances of the behavior of the vehicle.

In some examples, the playback agent analyzer 548 may use the object behaviors determined based on the log data 550, to determine behavior attributes associated with the objects. For motorized vehicles within the log data 550, behavior attributes may be referred to as driving attributes. In some cases, the driving attributes and/or behavior attributes may correspond to a single behavior or group of behaviors. For instance, low-level driving attributes of a vehicle may include attributes such as a reaction time of the vehicle, an average speed relative to the speed limit, an average following distance, an average turn signal usage distance, etc.

Additionally or alternatively, certain driving attributes and/or behavior attributes may include high-level attributes based on combinations of behaviors. For instance, playback agent analyzer 548 may use multiple driving behaviors, such as acceleration/braking rates, turning rates, driving speeds, following distances, etc., to determine an aggressive driving attribute for the vehicle. A different combination of driving behaviors (e.g., lane usage, traffic signal usage, driving speed, stopping/yielding behaviors, etc.) may be analyzed in combination to determine a law-abidance driving attribute. Yet another combination of driving behaviors (e.g., following distance, acceleration/braking rates, reaction time, trajectory scanning distance, etc.) may be analyzed in combination to determine a driving skill attribute for the vehicle. For these examples and other high-level driving attributes for vehicles (or high-level behavior attributes for other types of objects) the playback agent analyzer 548 may assign a score or metric for each of the high-level attributes based on the various combinations of behaviors determined from the log data 550. In some examples, a high-level driving attribute or combination of attributes may be referred to as a driving style or driving personality, and similar styles or personalities may be determined for pedestrians and non-motorized vehicle objects, based on their respective behaviors/attributes.

After the playback agent analyzer 548 determines behaviors and/or attributes for objects in the environment based on the log data 550, the planning component 536 may use the behaviors and attributes to control one or more smart agents within a simulation. In some examples, a single smart agent in a driving simulation may be assigned the same behaviors and/or attributes as a corresponding dynamic object within the log data 550. To assign a set of behaviors/attributes to a smart agent, the simulation system 532 may instantiate a particular version of the planning component 536 based on the behaviors/attributes, and/or may provide specific parameters when instantiating the planning component 536 corresponding to the desired set of behaviors/attributes for the smart agent. As noted above, a smart agent may be instantiated at the beginning of simulation, or may be converted from a playback agent during a driving simulation.

As discussed above, the planning component 536 may control the actions and behaviors of smart agents during a simulation, including any driving decisions of the object within the simulated environment. As used herein, a decision of a simulated vehicle or other simulated object may include any determination of a planning component 536 to control the simulated vehicle/object during the simulation. A driving decision determined by the planning component 536 for a simulated vehicle may correspond to any driving behavior determined by the playback agent analyzer 548 for the corresponding vehicle(s) in the log data 550.

In some examples, the planning component 536 may control a simulated vehicle based on a single corresponding vehicle from the log data 550. For instance, the planning component 536 may control the simulated vehicle to drive at the same speed relative to the speed limit, to have the same following distance, to have the same turn signal usage, and so on for any of the driving behaviors described herein. To determine a particular driving decision for the simulated vehicle, such as a driving speed on a street, a deceleration rate approaching a stop sign, a stopping location relative to the stop sign, and so on, the planning component 536 may match the same behaviors from the corresponding vehicle in the log data 550.

In other examples, the planning component 536 may determine a driving decision for a simulated vehicle without any matching behavior from the corresponding vehicle in the log data 550. For instance, if the corresponding vehicle did not stop at a stop sign or traffic light during the time period when the log data 550 was collected, then the planning component 536 might not have any direct driving behaviors to use when controlling the simulated vehicle in relation to stop signs or traffic lights. In such instances, the planning component 536 may use one or more indirect techniques to determine driving decisions for the simulated vehicle. The planning component 536 may use predetermined and/or default values for driving behaviors/decisions of the simulation vehicle in some cases. The planning component 536 also may determine a driving decision for the simulated vehicle based on correlations between different driving behaviors and/or weight values associated with the correlations. For instance, the planning component 536 may determine that a correlation exists between one driving behavior (e.g., time delay at stop sign) and other driving behaviors (e.g., average speed in relation to speed limit, following distance, steering rate, etc.). The planning component 536 also may determine weight values to indicate the strength of the correlation between different driving behaviors (e.g., a high weight value may indicate a stronger correlation between driving behaviors). Then, to determine a driving decision for a simulated vehicle when the corresponding driving behavior is not in the log data 550 for the corresponding vehicle, the planning component 536 may use the values for the correlated driving behaviors of the vehicle in the log data 550, and the associated weight values, to determine the driving decision for the simulated vehicle.

Additionally or alternatively, the planning component 536 may determine driving decisions for a simulated vehicle using higher-level driving attributes for a corresponding vehicle in the log data 550, such as an aggressive driving attribute score, a law-abidance driving attribute score, a reaction time driving attribute score, and/or a driving skill attribute score, etc. For instance, the planning component 536 may implement a machine-learning model and/or heuristics-based algorithm to determine lower-level driving decisions for the simulated vehicle (e.g., speeds, accelerations, following distances, turn signal usage, etc.) based on the higher-level attributes of the corresponding vehicle in the log data 550. As an example, the planning component 536 may determine a following distance for a first simulated vehicle based on a driver aggression metric and driver skill metric for a corresponding vehicle in the log data, while determining a different following distance for a second simulated vehicle based on the different driver aggression and skill metrics for a different corresponding vehicle in the log data.

The simulation system 532 may implement a one-to-one mapping in some examples, in which a single simulated vehicle is controlled based on the driving behaviors and attributes of a single corresponding vehicle in the log data 550. In other examples, the simulation system 532 may use a many-to-one mapping in which driving behaviors and attributes may be determined for multiple vehicles in the log data 550, and an aggregation of the behaviors/attributes from the multiple vehicles may be used to control a single simulated vehicle. A one-to-many mapping also may be used by the simulation system 532, in which the behaviors and/or attributes of a single vehicle in the log data 550 may be used to control multiple simulated vehicles in one or more driving simulations.

In still other examples, the simulation system 532 may configure simulations to include groups of simulated vehicles having a composition of behaviors/attributes based on groups of vehicles within one or more vehicle logs. For instance, the simulation system 532 may analyze a group of vehicles within one or more environments and times associated with the log data 550, to determine the numbers or percentages of the vehicles in the environment(s) that exhibit different driving behaviors or attributes. An example composition of vehicles from the log data 550 may include 20% highly aggressive drivers, 85% highly law-abiding drivers, 45% high skilled drivers, 70% of drivers who use bus lanes to pass, and so on. The simulation system 532 may different compositions of driving behaviors/attributes associated with different locations and/or different times of day. For instance, the composition of driving behaviors/attributes determined based on log data 550 collected during rush hour in one area may be different from the composition of driving behaviors/attributes determined based on log data 550 collected during a weekend afternoon in a different area. The simulation system 532 may select a particular composition of driving behaviors/attributes associated with a time and region, and may configure a group of simulated vehicles in a simulation to match the selected composition, thereby allowing the simulation system 532 to more realistically model groups of driver personality types in different areas and at different times.

Additionally, while certain examples herein refer to vehicles and driving simulations, as noted object similar or identical techniques may be used to map behaviors/attributes between non-motor-vehicle in the log data 550 (e.g., pedestrians, bicycles, etc.), and corresponding non-motor-vehicle objects in simulations.

Figure 6:
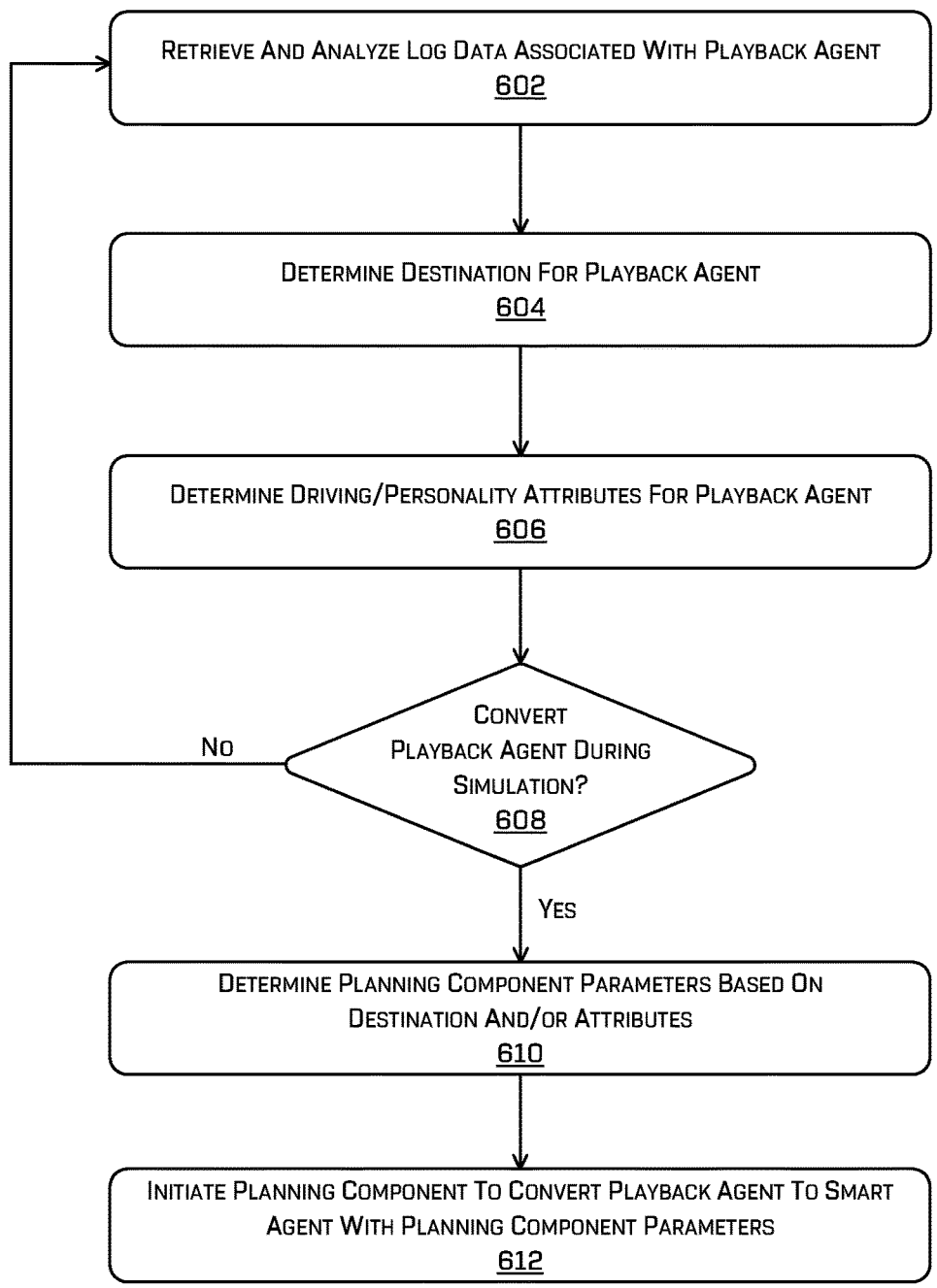
FIG. 6 is a flow diagram illustrating an example process for converting a playback agent to a smart agent during a driving simulation, in accordance with one or more implementations of the disclosure.

FIG. 6 is a flow diagram of an example process 600 for converting a playback agent to a smart agent during a driving simulation, in accordance with the various systems and techniques described herein. In some examples, the operations of process 600 may be performed by one or more components of a simulation system 532, alone or in conjunction with one or more vehicles 502. For instance, the techniques described herein for analyzing log data associated with a playback agent, determining destinations and/or driving behaviors/attributes for the playback agent, and determining and applying planning component parameters to control the decisions (e.g., path and behaviors) of smart agents, may be performed by the planning component 546 and/or the playback agent analyzer 548, discussed above.

At operation 602, the simulation system 532 may receive and analyze log data associated with a playback agent in the simulation. For example, the simulation system 532 may receive log data 550 from a vehicle 502, including various data observed and/or perceived by the vehicle 502 while traversing an environment. In particular, the log data received at operation 602 may include data associated with a particular agent (e.g., other vehicle, pedestrian, bicycle, etc.) detected within proximity of the vehicle 502, such as the attributes or characteristics (e.g., agent classification, size, shape, positions, yaws, velocities, trajectories, etc.). In some instances, the log data also may include operations and/or behaviors of the agents such as accidents or near accidents, traffic violations, crossing or jaywalking by pedestrians, cyclists, or animals, weather anomalies, construction zones, detours, school zones, etc. The log data 550 received in operation 602 may include raw sensor data and/or data based on sensor data captured at the vehicle 502.

At operation 604, the simulation system 532 may determine a destination for the playback agent within the simulation, based on the log data received in operation 602. The destination for the playback agent may be determined and/or inferred by the simulation system 532, based on the route/path traveled by the corresponding agent within the log data. In some cases, determining a destination for the playback agent may include analyzing additional log data for the corresponding agent, captured during times before or after the time period associated with the log-based driving simulation.

At operation 606, the simulation system 532 may determine one or more driving and/or personality attributes associated with the playback agent, based on the log data received in operation 602. For instance, the playback agent analyzer 548 may detect and analyze one or more driving behaviors and/or operations performed by the corresponding agent within the log data, to determine one or more driving styles and/or driver personality types for the playback agent. As an example, the playback agent analyzer 548 may analyze the log data associated with the particular agent to determine one or more aggression metrics, driving skill metrics, reaction time metrics, law abidance metrics, etc., for the agent.

At operation 608, the simulation system 532 may determine whether or not the playback agent will be converted to smart agent at some point during the driving simulation. As discussed above, during the course of the log-based driving simulation, agents may initially operate as playback agents and may behave within the simulation based on the behavior of the corresponding agent within the log data. The simulation system 532 may convert a playback agent into a smart agent in response to determining that an interaction may occur in the simulation between the playback agent and a deviating non-playback agent (e.g., smart agent or simulated vehicle). Not all playback agents may be converted to smart agents, and the during various driving simulations the simulation system 532 may convert some, all, or none of the playback agents into smart agents. In this example, when the particular playback agent analyzed in operations 602-606 is not converted to a smart agent (608:No), process 600 may return to operation 602 to continue monitoring the behavior of the playback agent as the simulation continues.

However, when the simulation system 532 determines during the simulation that the particular playback agent is to be converted to a smart agent (608:Yes), then at operation 610 the simulation system 532 determines one or more planning component parameters based on the destination of the playback agent determined in operation 604, and/or based on the driving/personality attributes for the playback agent determined in operation 606. Such parameters may include, but are not limited to, a parameter that determines whether the smart agent will use biking lanes when determining a route, a parameter that determines whether the smart agent will use lane splitting, a parameter that determines whether the smart agent will use lane sharing, a parameter representing the desired speed of the smart agent (based on agent type), parameters representing the maximum possible velocity and acceleration of the smart agent (based on agent type), parameters representing the desired distances of the smart agent from other agents in the simulated environment (based on agent type), parameters representing how the smart agent will respond to traffic lights, stop signs, yield signs, stop lines, school zones, construction zones, and parameters representing when the smart agent use turn signals, turn on/off lights, and/or engage other vehicle controls.

At operation 612, the simulation system 532 then may convert the playback agent to a smart agent by initiating a planning component to control the navigation and/or driving decision-making behaviors of the smart agent during the simulation. In some examples, initiating the planning component may include instantiating, executing, and/or configuring a planning component process based on the planning component parameters determined at operation 610, thereby configuring the planning component to control the navigation and/or driving decision-making behaviors of the smart agent in a manner that more accurately reflects the driving style and/or driver personality exhibited by the playback agent.

Figure 7:
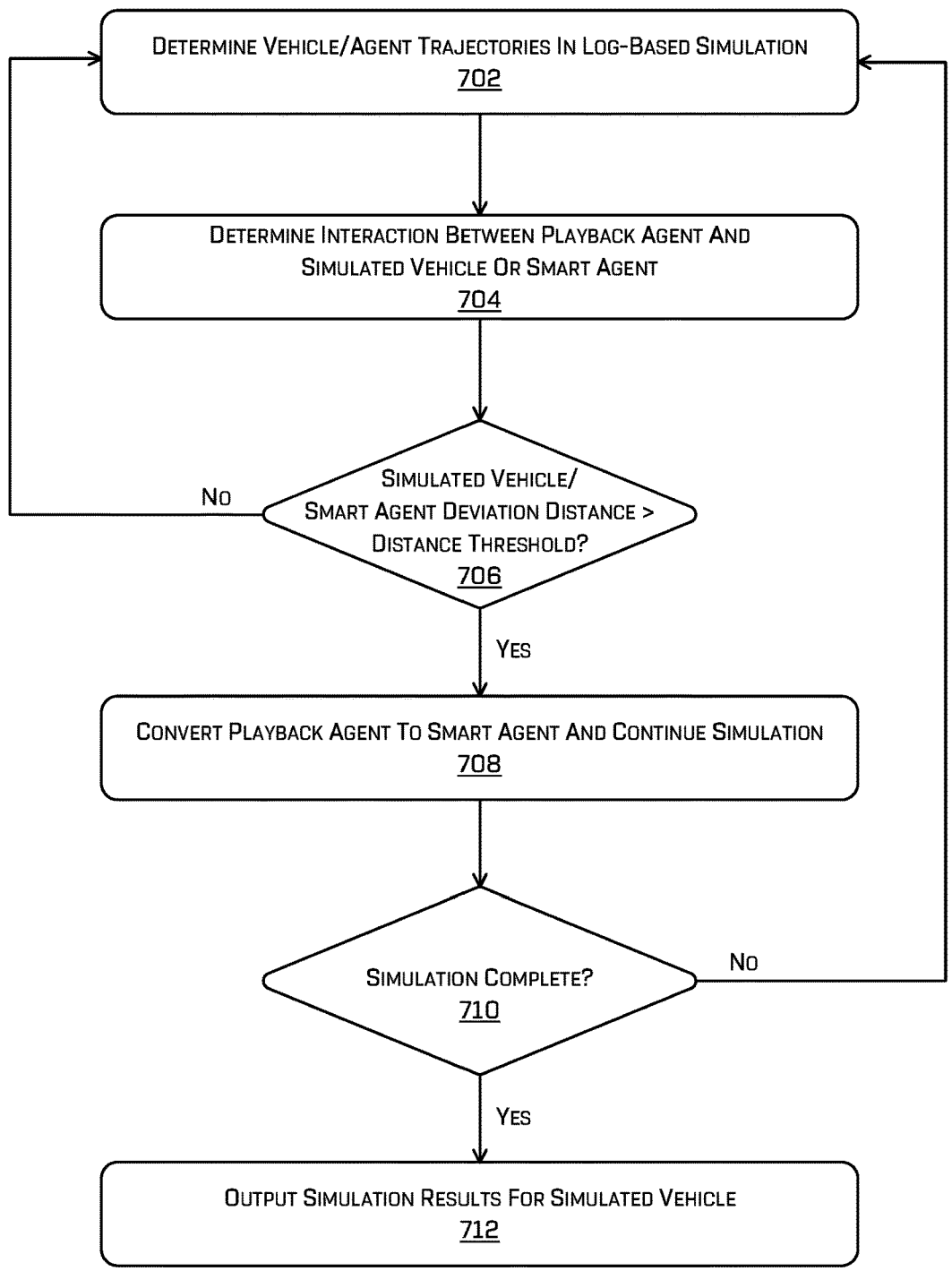
FIG. 7 is a flow diagram illustrating an example process of cascading conversions of playback agents to smart agents during a driving simulation, in accordance with one or more implementations of the disclosure.

FIG. 7 is a flow diagram of another example process 700 for converting playback agents to smart agents during a driving simulation, in accordance with the various systems and techniques described herein. In some examples, the operations of process 700 may be performed by one or more components of a simulation system 532, alone or in conjunction with one or more vehicles 502. For instance, the techniques described herein for determining interactions between agents in the driving simulation, and converting playback agents to smart agents, may be performed by the agent interaction monitor 542 and/or agent convertor 544, discussed above.

At operation 702, the simulation system 532 may determine trajectories for one or more vehicles/agents within the log-based driving simulation. A driving simulation may include multiple different agents operating within the simulated environment, including playback agents and smart agent. The trajectories of the playback agents within the simulation may be determined based on the positions of the corresponding agent within the log data. Therefore, for a playback agent, the simulation system 532 may determine the complete trajectory for the playback agent for the duration of the simulation, at any time based on the log data. In contrast, the simulated vehicle in the driving simulation and/or any other smart agents may be controlled by a planning component, rather than be based entirely on the log data. As a result, the trajectories for the simulated vehicle and the smart agents may be unknown until the simulation is executed, and the agent interaction monitor 542 may include the functionality to track and monitor the positions, poses, velocities, acceleration, and yaws of each smart agent in the simulation to determine the current and predicted trajectories.

At operation 704, the simulation system 532 may determine an interaction between a playback agent and non-playback agent within the driving simulation. In some examples, the agent interaction monitor 542 may determine interactions between playback agents and non-playback agents (e.g., a smart agent or the simulated vehicle) based on determining the positions, trajectories, sizes, and/or spatial regions associated with the agents in the driving simulation, and use the sizes and/or spatial regions along with the agent trajectories to determine the possibility or likelihood of an interaction between the agents. In some cases, the agent interaction monitor 542 may determine sets of bounding boxes associated each playback and non-playback agent in the simulation, where the bounding boxes may be based on the dimensions and orientation of the agent. Bounding boxes may include additional safety buffers in some cases, which may be based on the agent type, velocity, vulnerability, and/or various other agent attributes.

In some examples, the simulation system 532 may compare the sets of bounding boxes associated with the playback and non-playback agents in the driving simulation, and at each time interval may determine whether or not any overlap exists. When, at a particular time in the simulation, an overlap exists between the bounding box for a playback agent and the bounding box for a different non-playback agent, the agent interaction monitor 542 may determine that an interaction exists between the agents.

At operation 706, the simulation system 532 may determine whether the agent interacting with the playback agent (e.g., the smart agent or simulated vehicle) is a deviating agent having a deviation distance that meets or exceeds a deviation distance threshold. In some examples, the agent interaction monitor 542 may determine the deviation distance of the non-playback agent based on the difference in positions between the non-playback agent at the time of the interaction determined in operation 704, and the position of the corresponding agent within the log data at the same relative time. The agent interaction monitor 542 then may compare the deviation distance of the non-playback agent to a deviation distance threshold. When the deviation distance of the non-playback agent does not meet or exceed the deviation distance threshold (706:No), process 700 returns to operation 702 to continue monitoring the agents within the driving simulation. However, if the deviation distance associated with the smart agent or simulated vehicle meets or exceeds a deviation distance threshold (706:Yes), then at operation 708 the simulation system 532 may convert the playback agent to a smart agent.

As noted above, in some cases the deviation distance threshold may be set to zero, in which case operation 706 need not be performed. However, in other cases the deviation distance threshold may be non-zero values, such as 0.1 meters, 0.2 meters, 0.3 meters, . . . , 1 meter, etc.). In some examples, the value of the deviation distance threshold may be configurable, and may be adjusted up or down to produce different numbers and different timing of playback agent conversions during the simulation.

Additionally, although this example uses deviation distances to determine whether or not to convert a playback agent into a smart agent, in other examples the simulation system 532 may use yaw deviation values for the non-playback agent, which may be compared to a yaw deviation threshold. In various other examples, the agent interaction monitor 542 may apply deviation thresholds for distance, yaw, and/or other attributes of the agent (e.g., velocity, trajectory, etc.). Such thresholds may be predetermined values, or the agent interaction monitor 542 may determine and apply different deviation thresholds based on the type of the playback agent, the type of the non-playback agent, the velocities of one or both of the agents, etc.

At operation 708, based on the determination that the playback agent has interacted (or will interact) with a deviating non-playback agent during the simulation, the simulation system 532 may convert the playback agent to a smart agent. In some examples, the agent convertor 544 may convert the playback agent to a smart agent by executing and/or configuring the planning component 546 to control the navigation and/or driving decision-making behaviors of the smart agent for the duration of the driving simulation. As discussed above in reference to process 600, in some cases the planning component 546 may be instantiated, executed, and/or configured based on one or more planning component parameters determined for the specific smart agent, which may control the navigation and/or driving decision-making behaviors of the smart agent to more accurately reflects the driving style and/or driver personality of the playback agent.

At operation 710, the simulation system 532 may continue to execute the driving simulation, while determining whether the simulation is complete. The completion of a simulation corresponding to the end of the simulation, and/or to a determination during the execution of the simulation that the simulated vehicle performed consistent with predetermined outcome, or did not perform consistent with the predetermined outcome, and thus that the vehicle controllers operating the simulated vehicle have either passed or failed the simulation. When the log-based simulation is ongoing and has not yet completed (710:No), process 700 may return to operation 702 to continue to monitor the simulation and to perform conversions of additional playback agents to smart agents as needed. However, when the simulation completes (710:Yes), then at operation 712 the simulation system 532 may terminate the simulation processes and output or store the simulation results for the vehicle controllers operating the simulated vehicle. As noted above, the simulation results may identify the behaviors and/or performance of the simulated vehicle during the driving simulation, which may correspond to the behaviors and/or performance of the vehicle controllers being evaluated.

Processes 600 and 700 are each illustrated as a collection of blocks in a logical flow diagram, which represent a sequence of operations, some or all of which can be implemented in hardware, software, or a combination thereof. In the context of software, the blocks represent computer-executable instructions stored on one or more computer-readable media that, which when executed by one or more processors, perform the recited operations. Generally, computer-executable instructions include routines, programs, objects, components, encryption, deciphering, compressing, recording, data structures and the like that perform particular functions or implement particular abstract data types. The order in which the operations are described should not be construed as a limitation. Any number of the described blocks can be combined in any order and/or in parallel to implement the processes, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

Example Clauses

A. A system comprising: one or more processors; and one or more computer-readable media storing computer-executable instructions that, when executed, cause the one or more processors to perform operations comprising: executing a driving simulation including a simulated autonomous vehicle controlled by an autonomous vehicle controller, wherein the driving simulation is based at least in part on log data associated with a vehicle traversing an environment, wherein the log data includes first log data associated with a first object in the environment and second log data associated with a second object in the environment; during a first time period in the driving simulation, controlling a first simulated object based at least in part on the first log data, and controlling a second simulated object based at least in part on the second log data; determining a first interaction in the driving simulation between the simulated autonomous vehicle, and the first simulated object; based at least in part on determining the first interaction, using a first planning component to control the first simulated object during a second time period in the driving simulation after the first time period; determining a second interaction during the second time period in the driving simulation, between the first simulated object and the second simulated object; based at least in part on determining the second interaction, using a second planning component to control the second simulated object during a third time period in the driving simulation after the second time period; and determining a response by the autonomous vehicle controller to the driving simulation.

B. The system of paragraph A, wherein: during the first time period in the driving simulation, the simulated autonomous vehicle is controlled based at least in part by a planning component, and the first simulated object and the second simulated object are controlled based on the log data to respectively correspond to the first object in the environment and the second object in the environment; during the second time period in the driving simulation, the simulated autonomous vehicle and the first simulated object are controlled based at least in part by the planning component, and the second simulated object is controlled based on the log data to correspond to the second object in the environment; and during the third time period in the driving simulation, the simulated autonomous vehicle, the first simulated object, and the second simulated object are controlled based at least in part by the planning component.

C. The system of paragraph A, the operations further comprising: determining a deviation distance for the simulated autonomous vehicle at a time associated with the first interaction, wherein the deviation distance is based on a distance between a location of the vehicle within the log data and a corresponding location of the simulated autonomous vehicle during the driving simulation, wherein using the first planning component to control the first simulated object is based at least in part on the deviation distance.

D. The system of paragraph A, the operations further comprising: determining a driving attribute associated with the first object, based at least in part on the first log data, wherein using the first planning component to control the first simulated object is based at least in part on the driving attribute.

E. The system of paragraph A, the operations further comprising: controlling a third simulated object during the driving simulation based at least in part on third log data associated with a third object in the environment; and determining a third interaction in the driving simulation between the simulated autonomous vehicle and the third simulated object, including determining a distance between a location of the simulated autonomous vehicle at a time associated with the third interaction, and a corresponding location of the third object in the third log data, wherein controlling the third simulated object after determining the third interaction is based in least in part on the third log data to correspond to the third object in the environment.

F. A method comprising: executing a driving simulation, wherein the driving simulation is based at least in part on log data associated with a vehicle in an environment, wherein the log data includes first log data associated with a first object in the environment; controlling a first simulated object, during a first time period, to correspond with the first object within the environment; determining an interaction in the driving simulation between the first simulated object and a second simulated object; and controlling the first simulated object using a planning component during a second time period in the driving simulation after the first time period, wherein controlling the first simulated object using the planning component is based at least in part on the determining the interaction.

G. The method of paragraph F, wherein the log data comprises second log data associated with a second object in the environment, and wherein the method further comprises: determining a distance between a location of the second object in the second log data and a corresponding location of the second simulated object in the driving simulation; and initiating the planning component to control the first simulated object, based at least in part on determining that the distance meets or exceeds a threshold distance.

H. The method of paragraph F, further comprising: determining a driving attribute associated with the first simulated object; determining a destination for the first simulated object; and providing to the planning component a first parameter associated with the driving attribute and a second parameter associated with the destination, wherein the planning component is configured to control the first simulated object during the driving simulation based at least in part on the first parameter and the second parameter.

I. The method of paragraph H, wherein the driving attribute associated with the first simulated object, and the destination associated with the first simulated object, are determined based at least in part on the first log data.

J. The method of paragraph F, further comprising: controlling a third simulated object based at least in part on the log data, during the second time period in the driving simulation; determining a second interaction in the driving simulation between the first simulated object and the third simulated object; and controlling the third simulated object using the planning component during a third time period in the driving simulation after the second time period, wherein controlling the third simulated object using the planning component is based at least in part on determining the second interaction.

K. The method of paragraph F, further comprising: controlling a third simulated object based at least in part on the log data, during the second time period in the driving simulation; and determining a second interaction in the driving simulation between the first simulated object and the third simulated object, wherein controlling the third simulated object after determining the second interaction is based on the log data.

L. The method of paragraph F, wherein determining the interaction comprises: determining a first bounding box based on a first path associated with the first simulated object at a time during the driving simulation; determining a second bounding box based on a second path associated with the second simulated object at the time during the driving simulation; and determining an overlap between the first bounding box and the second bounding box.

M. The method of paragraph F, wherein the first simulated object comprises at least one of a simulated bicycle or a simulated pedestrian.

N. One or more non transitory computer readable media storing instructions executable by a processor, wherein the instructions, when executed, cause the processor to perform operations comprising: executing a driving simulation, wherein the driving simulation is based at least in part on log data associated with a vehicle in an environment, wherein the log data includes first log data associated with a first object in the environment; controlling a first simulated object, during a first time period, to correspond with the first object within the environment; determining an interaction in the driving simulation between the first simulated object and a second simulated object; and controlling the first simulated object using a planning component during a second time period in the driving simulation after the first time period, wherein controlling the first simulated object using the planning component is based at least in part on the determining the interaction.

O. The one or more non transitory computer readable media of paragraph N, wherein the log data comprises second log data associated with a second object in the environment, and wherein the operations further comprise: determining a distance between a location of the second object in the second log data and a corresponding location of the second simulated object in the driving simulation; and initiating the planning component to control the first simulated object, based at least in part on determining that the distance meets or exceeds a threshold distance.

P. The one or more non transitory computer readable media of paragraph N, the operations further comprising: determining a driving attribute associated with the first simulated object; determining a destination for the first simulated object; and providing to the planning component a first parameter associated with the driving attribute and a second parameter associated with the destination, wherein the planning component is configured to control the first simulated object during the driving simulation based at least in part on the first parameter and the second parameter.

Q. The one or more non transitory computer readable media of paragraph P, wherein the driving attribute associated with the first simulated object, and the destination associated with the first simulated object, are determined based at least in part on the first log data.

R. The one or more non transitory computer readable media of paragraph N, the operations further comprising: controlling a third simulated object based at least in part on the log data, during the second time period in the driving simulation; determining a second interaction in the driving simulation between the first simulated object and the third simulated object; and controlling the third simulated object using the planning component during a third time period in the driving simulation after the second time period, wherein controlling the third simulated object using the planning component is based at least in part on determining the second interaction.

S. The one or more non transitory computer readable media of paragraph N, the operations further comprising: controlling a third simulated object based at least in part on the log data, during the second time period in the driving simulation; and determining a second interaction in the driving simulation between the first simulated object and the third simulated object, wherein controlling the third simulated object after determining the second interaction is based on the log data.

T. The one or more non transitory computer readable media of paragraph N, wherein determining the interaction comprises: determining a first bounding box based on a first path associated with the first simulated object at a time during the driving simulation; determining a second bounding box based on a second path associated with the second simulated object at the time during the driving simulation; and determining an overlap between the first bounding box and the second bounding box.

U. A system comprising: one or more processors; and one or more computer-readable media storing computer-executable instructions that, when executed, cause the one or more processors to perform operations comprising: receiving log data associated with an environment, wherein the log data includes first log data associated with an object in the environment; classifying the object as a vehicle; identifying the vehicle as a first vehicle; determining a first driving attribute associated with the first vehicle and not another vehicle in the log data, based at least in part on the first log data; executing a driving simulation including a simulated environment corresponding to the environment and a first simulated vehicle corresponding to the first vehicle, wherein the first simulated vehicle controlled by a planning component; determining, using the planning component, a driving decision of the first simulated vehicle based at least in part on the first driving attribute associated with the first vehicle; and controlling the first simulated vehicle during the driving simulation based at least in part on the driving decision.

V. The system of paragraph U, the operations further comprising: determining a second driving attribute associated with a second vehicle in the environment, based at least in part on second log data within the log data, wherein the second driving attribute is different from the first driving attribute; and controlling a second simulated vehicle during the driving simulation based at least in part on the second driving attribute.

W. The system of paragraph U, wherein determining the first driving attribute associated with the first vehicle comprises: determining, based on the log data, a first value associated with a first instance of a driving behavior of the first vehicle, and a second value associated with a second instance of the driving behavior of the first vehicle; and determining a distribution associated with the first driving attribute based at least in part on the first value and the second value, wherein determining the driving decision of the first simulated vehicle comprises sampling a third value from the distribution.

X. The system of paragraph U, wherein a first driving path of the first vehicle through the environment is different from a second driving path determined by the planning component for the first simulated vehicle through the simulated environment.

Y. The system of paragraph U, wherein determining the driving decision of the first simulated vehicle comprises: determining a first value of the first driving attribute associated with the first vehicle, based at least in part on the first log data; determining a second driving attribute associated with the driving decision; determining a weight value associated with a correlation between the first driving attribute and the second driving attribute; and determining a second value of the second driving attribute, based at least in part on the first value of the first driving attribute and the weight value.

Z. A method comprising: receiving log data associated with an environment, wherein the log data includes first log data associated with a first object in the environment; determining a behavior attribute associated with the first object, based at least in part on the first log data; executing a simulation including a first simulated object controlled by a planning component; and determining, using the planning component, a decision of the first simulated object during the simulation, wherein the decision is based at least in part on the behavior attribute associated with the first object.

AA. The method of paragraph Z, further comprising: determining a second behavior attribute associated with a second object in the environment, based at least in part on second log data within the log data, wherein the second behavior attribute is different from the behavior attribute; and controlling a second simulated object during the simulation based at least in part on the second behavior attribute.

AB. The method of paragraph AA, wherein the first simulated object is a simulated motorized vehicle within the simulation, and the second simulated object is at least one of a pedestrian object or a non-motorized vehicle object within the simulation.

AC. The method of paragraph Z, wherein determining the behavior attribute associated with the first object comprises: determining, based on the log data, a first value associated with a first instance of a behavior of the first object, and a second value associated with a second instance of the behavior of the first object; and aggregating the first value and the second value to determine a value associated with the behavior attribute for the first object.

AD. The method of paragraph Z, further comprising: determining, based on the log data, a destination in the environment associated with the first object; and determining, based on the log data, a simulated destination of first simulated object within the simulation, wherein determining the decision of the first simulated object is based at least in part on the simulated destination.

AE. The method of paragraph Z, further comprising: determining second log data associated with a second object in the environment, wherein the first object and the second object have a same object classification; and determining a second behavior attribute associated with the second object, based at least in part on the second log data, wherein determining the decision of the first simulated object is based at least in part on the second behavior attribute associated with the second object.

AF. The method of paragraph Z, further comprising: determining a first path of the first object through the environment, based at least in part on the first log data; and determining, by the planning component, a second path for the first simulated object through a simulated environment of the simulation, wherein the first path of the first object is different from the second path determined by the planning component for the first simulated object.

AG. The method of paragraph Z, wherein determining the decision of the first simulated object comprises: determining a first value of the behavior attribute associated with the first object, based at least in part on the first log data; determining a weight value associated with a correlation between the behavior attribute and a second behavior attribute; determining a second value of the second behavior attribute, based at least in part on the first value of the behavior attribute and the weight value; and determining the decision based at least in part on the second value of the second behavior attribute.

AH. One or more non transitory computer readable media storing instructions executable by a processor, wherein the instructions, when executed, cause the processor to perform operations comprising: receiving log data associated with an environment, wherein the log data includes first log data associated with a first object in the environment; determining a behavior attribute associated with the first object, based at least in part on the first log data; executing a simulation including a first simulated object controlled by a planning component; and determining, using the planning component, a decision of the first simulated object during the simulation, wherein the decision is based at least in part on the behavior attribute associated with the first object.

AI. The one or more non transitory computer readable media of paragraph AH, the operations further comprising: determining a second behavior attribute associated with a second object in the environment, based at least in part on second log data within the log data, wherein the second behavior attribute is different from the behavior attribute; and controlling a second simulated object during the simulation based at least in part on the second behavior attribute.

AJ. The one or more non transitory computer readable media of paragraph AH, wherein determining the behavior attribute associated with the first object comprises: determining, based on the log data, a first value associated with a first instance of a behavior of the first object, and a second value associated with a second instance of the behavior of the first object; and aggregating the first value and the second value to determine a value associated with the behavior attribute for the first object.

AK. The one or more non transitory computer readable media of paragraph AH, the operations further comprising: determining, based on the log data, a destination in the environment associated with the first object; and determining, based on the log data, a simulated destination of first simulated object within the simulation, wherein determining the decision of the first simulated object is based at least in part on the simulated destination.

AL. The one or more non transitory computer readable media of paragraph AH, the operations further comprising: determining second log data associated with a second object in the environment, wherein the first object and the second object have a same object classification; and determining a second behavior attribute associated with the second object, based at least in part on the second log data, wherein determining the decision of the first simulated object is based at least in part on the second behavior attribute associated with the second object.

AM. The one or more non transitory computer readable media of paragraph AH, the operations further comprising: determining a first path of the first object through the environment, based at least in part on the first log data; and determining, by the planning component, a second path for the first simulated object through a simulated environment of the simulation, wherein the first path of the first object is different from the second path determined by the planning component for the first simulated object.

AN. The one or more non transitory computer readable media of paragraph AH, wherein determining the decision of the first simulated object comprises: determining a first value of the behavior attribute associated with the first object, based at least in part on the first log data; determining a weight value associated with a correlation between the behavior attribute and a second behavior attribute; determining a second value of the second behavior attribute, based at least in part on the first value of the behavior attribute and the weight value; and determining the decision based at least in part on the second value of the second behavior attribute.

While the example clauses described above are described with respect to particular implementations, it should be understood that, in the context of this document, the content of the example clauses can be implemented via a method, device, system, a computer-readable medium, and/or another implementation. Additionally, any of examples A-AN may be implemented alone or in combination with any other one or more of the examples A-AN.

Conclusion

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples may be used and that changes or alterations, such as structural changes, may be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code modules and/or computer-executable instructions executed by one or more computers or processors, hardware, or some combination thereof. Some or all of the methods may alternatively be embodied in specialized computer hardware.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing modules, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art.

Many variations and modifications may be made to the above-described examples, the elements of which are to be understood as being among other acceptable examples. All such modifications and variations are intended to be included herein within the scope of this disclosure and protected by the following claims.

What is claimed is:

1. A system comprising:
one or more processors; and
one or more computer-readable media storing computer-executable instructions that, when executed, cause the one or more processors to perform operations comprising:
    executing a driving simulation including a simulated autonomous vehicle controlled by an autonomous vehicle controller, wherein the driving simulation is based at least in part on log data associated with a vehicle traversing an environment, wherein the log data includes first log data associated with a first object in the environment and second log data associated with a second object in the environment;
    during a first time period in the driving simulation, controlling a first simulated object based at least in part on the first log data, and controlling a second simulated object based at least in part on the second log data;
    determining a first interaction in the driving simulation between the simulated autonomous vehicle, and the first simulated object;
    based at least in part on determining the first interaction, using a first planning component to control the first simulated object during a second time period in the driving simulation after the first time period;
    determining a second interaction during the second time period in the driving simulation, between the first simulated object and the second simulated object;
    based at least in part on determining the second interaction, using a second planning component to control the second simulated object during a third time period in the driving simulation after the second time period; and
    determining a response by the autonomous vehicle controller to the driving simulation.

2. The system of claim 1, wherein:
during the first time period in the driving simulation, the simulated autonomous vehicle is controlled based at least in part by a planning component, and the first simulated object and the second simulated object are controlled based on the log data to respectively correspond to the first object in the environment and the second object in the environment;
during the second time period in the driving simulation, the simulated autonomous vehicle and the first simulated object are controlled based at least in part by the planning component, and the second simulated object is controlled based on the log data to correspond to the second object in the environment; and
during the third time period in the driving simulation, the simulated autonomous vehicle, the first simulated object, and the second simulated object are controlled based at least in part by the planning component.

3. The system of claim 1, the operations further comprising:
- determining a deviation distance for the simulated autonomous vehicle at a time associated with the first interaction, wherein the deviation distance is based on a distance between a location of the vehicle within the log data and a corresponding location of the simulated autonomous vehicle during the driving simulation,
- wherein using the first planning component to control the first simulated object is based at least in part on the deviation distance.

4. The system of claim 1, the operations further comprising:
- determining a driving attribute associated with the first object, based at least in part on the first log data,
- wherein using the first planning component to control the first simulated object is based at least in part on the driving attribute.

5. The system of claim 1, the operations further comprising:
- controlling a third simulated object during the driving simulation based at least in part on third log data associated with a third object in the environment; and
- determining a third interaction in the driving simulation between the simulated autonomous vehicle and the third simulated object, including determining a distance between a location of the simulated autonomous vehicle at a time associated with the third interaction, and a corresponding location of the third object in the third log data,
- wherein controlling the third simulated object after determining the third interaction is based in least in part on the third log data to correspond to the third object in the environment.

6. A method comprising:
- executing a driving simulation including a simulated autonomous vehicle controlled by an autonomous vehicle controller, wherein the driving simulation is based at least in part on log data associated with a vehicle traversing an environment, wherein the log data includes first log data associated with a first object in the environment and second log data associated with a second object in the environment;
- during a first time period in the driving simulation, controlling a first simulated object to correspond with the first object within the environment, and controlling a second simulated object to correspond with the second object within the environment;
- determining a first interaction in the driving simulation between the simulated autonomous vehicle and the first simulated object;
- controlling the first simulated object using a first planning component during a second time period in the driving simulation after the first time period, wherein controlling the first simulated object using the first planning component is based at least in part on the determining the first interaction;
- determining a second interaction during the second time period in the driving simulation, between the first simulated object and the second simulated object;
- controlling the second simulated object using the first planning component or a second planning component during a third time period in the driving simulation after the second time period, wherein controlling the second simulated object is based at least in part on the determining the second interaction; and
- determining a response by the autonomous vehicle controller to the driving simulation.

7. The method of claim 6, wherein the method further comprises:
- determining a distance between a location of the second object in the second log data and a corresponding location of the second simulated object in the driving simulation; and
- initiating the first planning component to control the first simulated object, based at least in part on determining that the distance meets or exceeds a threshold distance.

8. The method of claim 6, further comprising:
- determining a driving attribute associated with the first simulated object;
- determining a destination for the first simulated object; and
- providing to the first planning component a first parameter associated with the driving attribute and a second parameter associated with the destination, wherein the first planning component is configured to control the first simulated object during the driving simulation based at least in part on the first parameter and the second parameter.

9. The method of claim 8, wherein the driving attribute associated with the first simulated object, and the destination associated with the first simulated object, are determined based at least in part on the first log data.

10. The method of claim 6, further comprising:
- controlling the second simulated object based at least in part on the second log data, during the second time period in the driving simulation.

11. The method of claim 6, wherein determining the first interaction comprises:
- determining a first bounding box based on a first path associated with the first simulated object at a time during the driving simulation;
- determining a second bounding box based on a second path associated with the second simulated object at the time during the driving simulation; and
- determining an overlap between the first bounding box and the second bounding box.

12. The method of claim 6, wherein the first simulated object comprises at least one of a simulated bicycle or a simulated pedestrian.

13. The method of claim 6, further comprising:
- determining a deviation distance for the simulated autonomous vehicle at a time associated with the first interaction, wherein the deviation distance is based on a distance between a location of the vehicle within the log data and a corresponding location of the simulated autonomous vehicle during the driving simulation,
- wherein using the first planning component to control the first simulated object is based at least in part on the deviation distance.

14. One or more non-transitory computer-readable media storing instructions executable by a processor, wherein the instructions, when executed, cause the processor to perform operations comprising:
- executing a driving simulation including a simulated autonomous vehicle controlled by an autonomous vehicle controller, wherein the driving simulation is based at least in part on log data associated with a vehicle traversing an environment, wherein the log data includes first log data associated with a first object in the environment and second log data associated with a second object in the environment;

during a first time period in the driving simulation, controlling a first simulated object to correspond with the first object within the environment, and controlling a second simulated object to correspond with the second object within the environment;

determining a first interaction in the driving simulation between the simulated autonomous vehicle and the first simulated object;

controlling the first simulated object using a first planning component during a second time period in the driving simulation after the first time period, wherein controlling the first simulated object using the first planning component is based at least in part on the determining the first interaction;

determining a second interaction during the second time period in the driving simulation, between the first simulated object and the second simulated object;

controlling the second simulated object using the first planning component or a second planning component during a third time period in the driving simulation after the second time period, wherein controlling the second simulated object is based at least in part on the determining the second interaction; and determining a response by the autonomous vehicle controller to the driving simulation.

15. The one or more non-transitory computer-readable media of claim 14, wherein the operations further comprise:

determining a distance between a location of the second object in the second log data and a corresponding location of the second simulated object in the driving simulation; and initiating the first planning component to control the first simulated object, based at least in part on determining that the distance meets or exceeds a threshold distance.

16. The one or more non-transitory computer-readable media of claim 14, the operations further comprising:

determining a driving attribute associated with the first simulated object;

determining a destination for the first simulated object; and providing to the first planning component a first parameter associated with the driving attribute and a second parameter associated with the destination, wherein the first planning component is configured to control the first simulated object during the driving simulation based at least in part on the first parameter and the second parameter.

17. The one or more non-transitory computer-readable media of claim 16, wherein the driving attribute associated with the first simulated object, and the destination associated with the first simulated object, are determined based at least in part on the first log data.

18. The one or more non-transitory computer-readable media of claim 14, the operations further comprising:

controlling the second simulated object based at least in part on the second log data, during the second time period in the driving simulation.

19. The one or more non-transitory computer-readable media of claim 14, wherein determining the first interaction comprises:

determining a first bounding box based on a first path associated with the first simulated object at a time during the driving simulation;

determining a second bounding box based on a second path associated with the second simulated object at the time during the driving simulation; and determining an overlap between the first bounding box and the second bounding box.

20. The one or more non-transitory computer-readable media of claim 14, the operations further comprising:

determining a deviation distance for the simulated autonomous vehicle at a time associated with the first interaction, wherein the deviation distance is based on a distance between a location of the vehicle within the log data and a corresponding location of the simulated autonomous vehicle during the driving simulation, wherein using the first planning component to control the first simulated object is based at least in part on the deviation distance.

* * * * *